(12) United States Patent
Hirota

(10) Patent No.: US 7,125,654 B2
(45) Date of Patent: Oct. 24, 2006

(54) TRANSVERSE ELECTRIC-FIELD TYPE LIQUID CRYSTAL DISPLAY DEVICE, PROCESS OF MANUFACTURING THE SAME, AND SCAN-EXPOSING DEVICE

(75) Inventor: Naoto Hirota, Toyokawa (JP)

(73) Assignee: Obayashiseikou Co., Ltd., Aichi (JP)

( * ) Notice: Subject to any disclaimer, the term of this patent is extended or adjusted under 35 U.S.C. 154(b) by 369 days.

(21) Appl. No.: 10/606,175

(22) Filed: Jun. 25, 2003

(65) Prior Publication Data
US 2004/0048405 A1    Mar. 11, 2004

(30) Foreign Application Priority Data
Jul. 1, 2002    (JP) .............. 2002-237219

(51) Int. Cl.
G02F 1/1333    (2006.01)

(52) U.S. Cl. .............. 430/319; 430/321; 430/394; 430/396; 438/30

(58) Field of Classification Search .............. None
See application file for complete search history.

(56) References Cited

U.S. PATENT DOCUMENTS 6,255,130 B1* 7/2001 Kim .............. 438/30
6,451,635 B1* 9/2002 Park et al. .............. 438/158
6,744,486 B1* 6/2004 Kim et al. .............. 349/187
6,876,428 B1* 4/2005 Kwak et al. .............. 349/187
2002/0028411 A1* 3/2002 Park et al. .............. 430/314

FOREIGN PATENT DOCUMENTS

JP    2000-66240    3/2000
JP    3126645    11/2000

* cited by examiner

Primary Examiner—John A. McPherson
(74) Attorney, Agent, or Firm—Muramatsu & Associates

(57) ABSTRACT

A process of manufacturing a liquid crystal display device of transverse electric-field type, where a halftone photomask has a fully light-shielding area preventing UV irradiation of a portion of an active matrix substrate in which a thin-film transistor element is to be formed, so that the photoresist pattern includes a positive resist portion which is formed on the portion of the substrate. The halftone mask further has a fully light-transmitting area which permits full UV transmission therethrough to provide the photoresist pattern with a resist-free area which corresponds to a portion of the substrate in which a contact hole serving as a third connection portion connecting an external scanning-line driver circuit and a scanning-line terminal portion through a junction electrode is to be formed. Also disclosed is a scan-exposing device used in the manufacturing process.

6 Claims, 24 Drawing Sheets

PRIOR ART

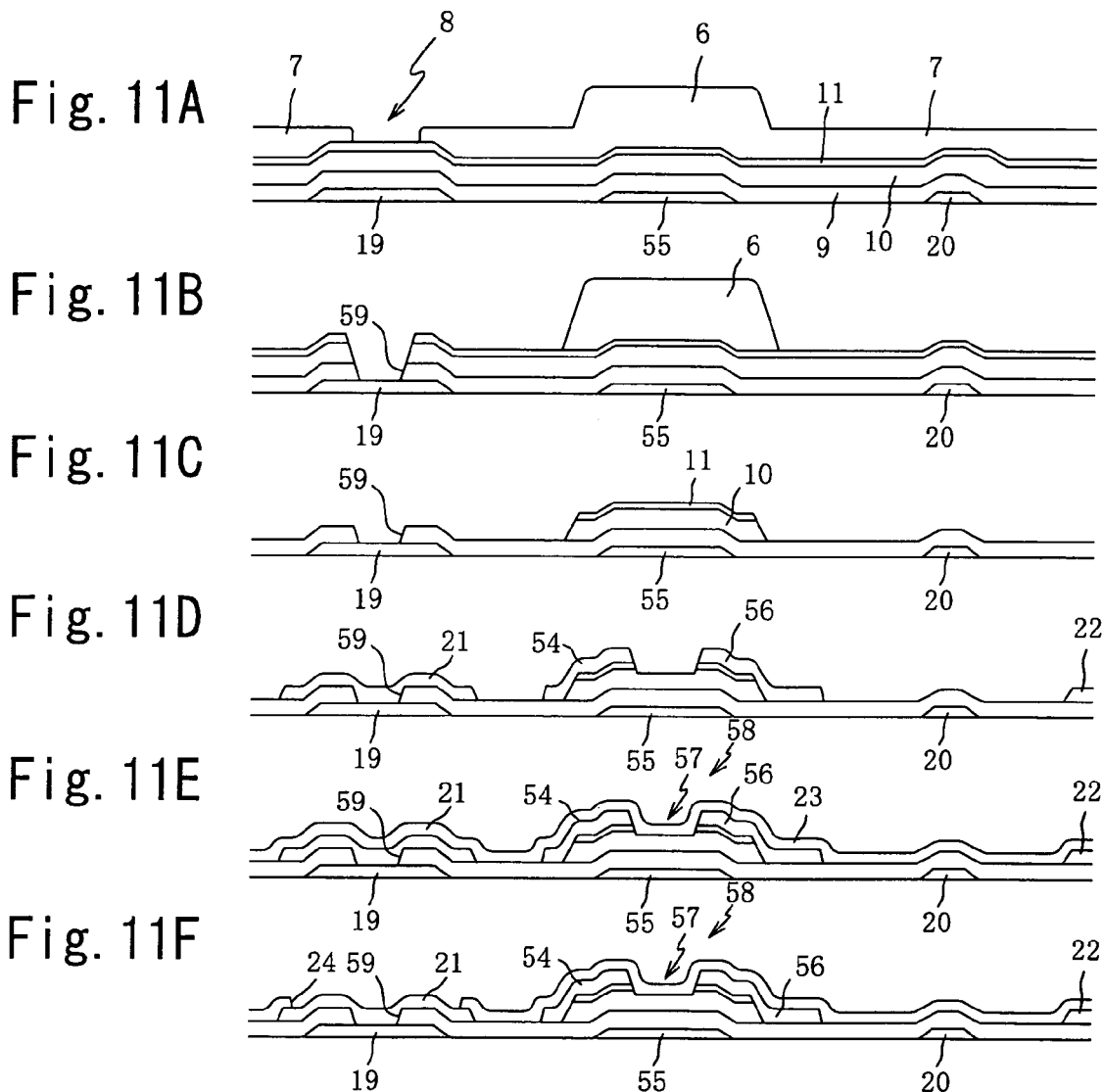

PRIOR ART

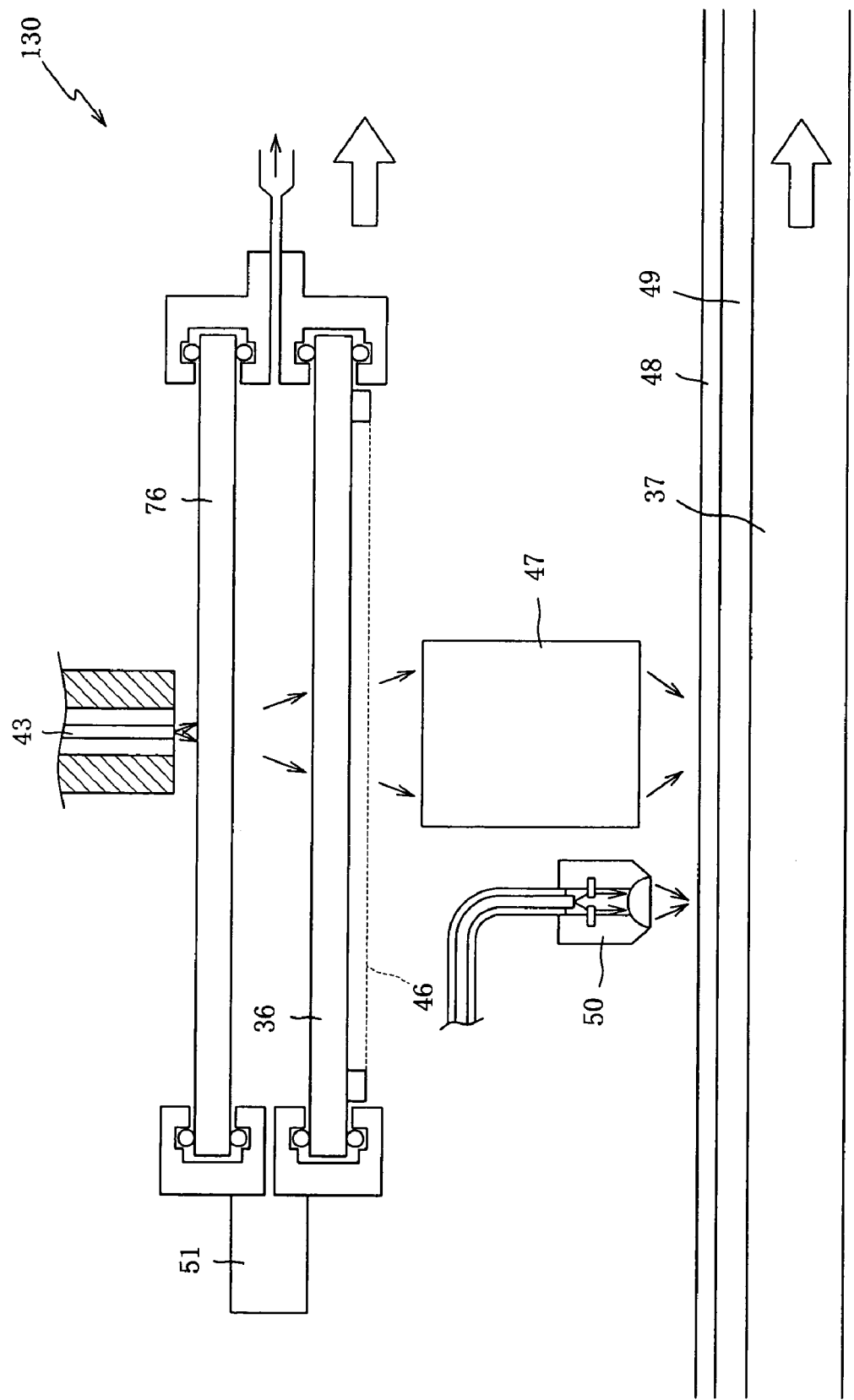

TRANSVERSE ELECTRIC-FIELD TYPE LIQUID CRYSTAL DISPLAY DEVICE, PROCESS OF MANUFACTURING THE SAME, AND SCAN-EXPOSING DEVICE

FIELD OF THE INVENTION

The present invention relates to a liquid crystal display device of transverse electric-field type which is available at a relatively low cost and which permits high-quality displaying of images on a wide screen with a wide field of view or a large angle of visibility. The present invention is further concerned with a process of manufacturing such a liquid crystal display device, and a scan-exposing device used in the process of manufacture.

BACKGROUND OF THE INVENTION

JP-A-2000-066240 (Laid-open Publication of Japanese Patent Application) discloses a halftone exposure technique effective to reduce the required number of steps in a photomasking process in the manufacture of a liquid crystal display device of active matrix type. The halftone exposure technique disclosed in this publication uses a slit-type photomask 70 which has slits 73 formed in its local portions, as shown in FIG. 1. The locally formed slots 73 serve to adjust an average amount of exposure of an active matrix substrate 9 to a light generated by an exposing device, for forming a first pattern of a resist on a portion of the substrate 9 which corresponds to a channel portion of a thin-film transistor. The first pattern of resist has a positive resist portion 6 having a relatively large thickness. and a positive resist portion 7 having a smaller thickness than that of the positive resist portion 6. Then, an etching operation is performed on the substrate 9 so that only those portions of semiconductor layers 10, 11, a barrier metal layer 12 and a low-resistance metal layer 13 which underlie the positive resist portions 6, 7 of the first resist pattern are left, whereby the semiconductor layers 10, 11 are formed into semiconductor elements. The thickness of the positive resist portions 6, 7 are then reduced by an ashing operation, so that the positive resist portion 7 in the area corresponding to the channel portion of the thin-film transistor element is removed, with a result of formation of a second resist pattern which consists of only the positive resist portions 6. The channel portion of the thin-film transistor element is formed by etching using the second resist pattern. According to the halftone exposure technique disclosed in JP-A-2000-066240 described above, a single photomasking step permits formation of the semiconductor layers into the semiconductor elements, and formation of the channel portion of the thin-film transistor element. Accordingly, the halftone exposure technique makes it possible to reduce the required number of the photomasks, and considerably lower the cost of manufacture of the active matrix substrate, as compared with the conventional photomasking technique. The halftone exposure technique of JP-A-200-066240 is shown in FIG. 22.

Where the halftone exposure technique as disclosed in JP-A-2000-066240 is used to form the channel portion of the thin-film transistor element, however, the formed channel portion of the thin-film transistor element tends to have a relatively large amount of variation in its dimensional accuracy, leading to instability factors in mass production of a product including the thin-film transistor elements. Further, a variation in the amount of overlapping between a gate electrode and source and drain electrodes causes a display variation in the halftone area, giving rise to a problem of reduction in the yield ratio of the active matrix substrate.

SUMMARY OF THE INVENTION

It is therefore a first object of the present invention to provide a process which permits economical high-yield manufacture of a liquid crystal display device of transverse electric-field type which has a considerably large size and a considerably wide field of view. A second object of the invention is to provide such a liquid crystal display device. A third object of the invention is to provide a scan-exposing device used in the process of manufacture according to the present invention.

The first object may be achieved according to a first aspect of this invention, which provides a process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with the picture-element electrodes, and (g) thin-film transistor elements connected to the scanning lines and the image-signal wires, and wherein scanning lines, the image-signal wires, the picture-element electrodes, the common electrodes and the thin-film transistor elements are provided on a surface of one of the pair of substrates which faces the layer of the liquid crystal composition, the process being characterized by comprising:

a halftone exposing step of exposing a photoresist on the above-indicated one of the pair of substrates to a radiation, and thereby forming (i) first positive resist portions that cover portions of a semiconductor layer formed on the above-indicated one substrate, which portions correspond to the thin-film transistor elements, each of the first positive resist portions having a predetermined first thickness, (ii) resist-free portions that cover portions of the semiconductor layer which correspond to a first connecting portion, a second connecting portion and a third connecting portion, the first connecting portion being provided to form first static-electricity protective transistor elements connecting the common electrodes and the scanning lines, the second connecting portion being provided to form second static-electricity protective transistor elements connecting the common electrodes and the image-signal wires, and the third connecting portion connecting the external scanning-line driver circuit and the scanning-line terminal portions, and (iii) second positive resist portions having a second thickness smaller than the first thickness and covering the other portions of the semiconductor layer.

In the process of manufacturing a liquid crystal display device of transverse electric-field type according to the first aspect of the invention, the halftone exposing step is implemented to form (i) the first positive resist portions which have the first thickness and which cover the portions of the semiconductor layer which correspond to the thin-film transistor elements, (ii) the resist-free areas covering the portions of the semiconductor layer which correspond to the first connecting portion provided to form the first static-electricity protective transistor elements connecting the common electrodes and the scanning lines, the second connecting portion provided to form the second static-electricity protective transistor elements connecting the common electrodes and the image-signal wires, and the third connecting portion connecting the external scanning-line driver circuit and the scanning-line terminal portions, and (iii) the second positive resist portions which have a second thickness smaller than the first thickness and which cover the other portions of the semiconductor layer. Accordingly, the portions of the semiconductor layer corresponding to the first, second and third connecting portions are first removed by subjecting the substrate with the semiconductor layer to an etching operation, and then the second resist portions having the second thickness are removed by subjecting the first and second positive resist portions to an ashing operation, for example, so that the semiconductor layers are formed into semiconductor elements.

According to a first preferred form of the process of the first aspect of the invention, the halftone exposing step is implemented by using a halftone photomask having a fully light-transmitting area, a semi-light-transmitting area and a fully light-shielding area, such that the first positive resist portions having the first thickness are formed with the fully light-shielding area of the halftone photomask preventing the radiation from exposing the portions of the semiconductor layer which correspond to the thin-film transistor elements, and the resist-free areas are formed with the fully light-transmitting area of the halftone photomask permitting the radiation to expose the portions of the semiconductor layer which correspond to the first, second and third connecting portions of the semiconductor layer, while the second positive resist portions having the second thickness are formed with the semi-light-transmitting area of the halftone photomask permitting partial exposure of the other portions of the semiconductor layer to the radiation.

According to a second preferred form of the process of the first aspect of the invention, the halftone exposing step is implemented by using a photomask having a fully light-transmitting area and a fully light-shielding area, while the photoresist on the semiconductor layer is exposed through the photomask to a ultraviolet radiation whose irradiation energy density is determined so as to remove only a portion of a thickness of the photoresist, the halftone exposing step being implemented such that the first positive resist portions having the first thickness are formed with the fully light-shielding area of the photomask preventing the ultraviolet radiation from exposing the portions of the semiconductor layer which correspond to the thin-film transistor elements, while the second positive resist portions having the second thickness are formed with the fully light-transmitting area of the photomask permitting the ultraviolet radiation to expose the above-indicated other portions of the semiconductor layer, and wherein the halftone exposing step further includes an operation performed after the first and second positive resist portions are formed, to form the resist-free areas by exposing portions of the photoresist exposed to the ultraviolet radiation, which portions cover the portions of the semiconductor layer corresponding to the first, second and third connecting portions, such that the portions of the photoresist are exposed to a radiation through another photomask different from the photomask used to form the first and second positive resist portions, or to respective spot lights of a condensed ultraviolet radiation.

According to a third preferred form of the process of the first aspect of the invention, the halftone exposing step is implemented by using a photomask having a fully light-transmitting area and a fully light-shielding area, while the photoresist on the semiconductor layer is exposed through the photomask to a ultraviolet radiation whose irradiation energy density is determined so as to remove only a portion of a thickness of the photoresist, the halftone exposing step being implemented such that the first positive resist portions having the first thickness are formed with the fully light-shielding area of the photomask preventing the ultraviolet radiation from exposing the portions of the semiconductor layer which correspond to the thin-film transistor elements, and the second positive resist portions having the second thickness are formed with the fully light-transmitting area of the photomask permitting the ultraviolet radiation to expose the above-indicated other portions of the semiconductor layer, while at the same time the resist-free areas are formed by exposing portions of the photoresist covering the portions of the semiconductor layer corresponding to the first, second and third connecting portions, to respective spot lights of a condensed ultraviolet radiation.

The second object described above may be achieved according to a second aspect of the present invention, which provides a liquid crystal display device of transverse electric-field type manufactured by a process according to the first aspect of the invention described above.

According to one preferred form of the liquid crystal display of transverse electric-field type of the second aspect of the invention, the first and second connecting portions have widths which are about ½ to about $\frac{1}{100}$ of that of the third connecting portion.

The third object may be achieved according to a third aspect of this invention, which provides a scan-exposing device used in a process of manufacturing a liquid crystal display device of transverse electric-field type according to the first aspect of the invention, the scan-exposing device comprising:

a film-thickness measuring device operable to measure an actual value of the second thickness of the second positive resist portions formed in the halftone exposing step; and a feedback control device operable to feedback-control an amount of exposure of the photoresist to the radiation, depending upon the actual value of the second thickness of the second positive resist portions measured by the film-thickness measuring device.

The third object may also be achieved according to a fourth aspect of this invention, which provides a scan-exposing device used in a process of manufacturing a liquid crystal display device of transverse electric-field type according to the first aspect of this invention, the scan-exposing device comprising:

a white light interferometer operable to measure at least one of (a) a difference between actual values of the first and second thicknesses of the first and second positive resist portions formed in the halftone exposing step, and (b) the actual value of the second thickness of the second positive resist portions with respect to the resist-free areas; and a feedback control device operable to feedback-control an amount of exposure of the photoresist to the radiation, depending upon the above-indicated at least one of the difference and the actual value of the second thickness which has been measured by the white light interferometer.

The third object described above may also be achieved according to a fifth aspect of this invention, which provides a scan-exposing device used in a process of manufacturing a liquid crystal display device including a pair of substrates at least one of which is transparent, and a layer of a liquid crystal composition interposed between the pair of substrates, the scan-exposing device being operable to scan-expose a photoresist applied to one of the pair of substrates, to a ultraviolet radiation through a quartz photomask substrate having a desired light-shielding pattern, the scan-exposing device comprising:

at least one Bernoulli chuck of non-contact type disposed so as to be opposed to one of opposite surfaces of the above-indicated one substrate upon which the ultraviolet radiation is incident, the above-indicated at least one Bernoulli chuck being operable to reduce an amount of deflection of the quartz photomask substrate due to its own weight while the quartz photomask substrate is placed in a horizontally extending position;

a laser displacement meter operable to measure an amount of displacement of the above-indicated one of opposite surfaces of the quartz photomask substrate in a vertical direction; and a substrate-position control device operable to control the at least one Bernoulli chuck on the basis of the amount of vertical displacement measured by the laser displacement meter, while the photoresist is scan-exposed to the ultraviolet radiation through the quartz photomask substrate.

The second object may also be achieved according to a sixth aspect of the invention, which provides a liquid crystal display device of transverse electric-field type manufactured by using a scan-exposing device according to the fifth aspect of the invention described above.

The third object may also be achieved according to a seventh aspect of this invention, which provides a scan-exposing device used in a process of manufacturing a liquid crystal display device including a pair of substrates at least one of which is transparent, and a layer of a liquid crystal composition interposed between the pair of substrates, the scan-exposing device being operable to scan-expose a photoresist applied to one of the pair of substrates, through a quartz photomask substrate having a desired light-shielding pattern, the scan-exposing device comprising:

a quartz substrate disposed in opposition to the quartz photomask substrate and cooperating with the quartz photomask substrate to define therebetween an air-tight space;

a pressure sensor operable to detect a pressure within the air-tight space; and a pressure control device operable to control a difference between the pressure within the air-tight space measured by the pressure sensor and an atmospheric pressure such that the pressure within the air-tight space is lower than the atmospheric pressure by the difference so as to reduce an amount of deflection of the quartz photomask substrate due to its own weight, while the photoresist is scan-exposed through the quartz photomask substrate.

The second object may also be achieved according to an eighth aspect of the invention, which provides a liquid crystal display device of transverse electric-field type manufactured by using a scan-exposing device according to the seventh aspect of the invention described above.

The third object may also be achieved according to a ninth aspect of the invention, which provides a scan-exposing device used in a process of manufacturing a liquid crystal display device including a pair of substrates at least one of which is transparent, and a layer of a liquid crystal composition interposed between the pair of substrates, the scan-exposing device being operable to scan-expose a photoresist applied to one of the pair of substrates, through a photomask having a desired light-shielding pattern, the scan-exposing device comprising:

a slide carrying the above-indicated one of the pair of substrates;

photomask scan-exposing means for scan-exposing the photoresist while the photomask and the slide are moved at a same speed in a same direction; and spot scan-exposing means for directly spot scan-exposing the photoresist without using the photomask, with a spot size ranging from about 0.1 mm to about 0.5 mm, and wherein the photomask scan-exposing means and the spot scan-exposing means are operable concurrently to expose the photoresist.

The second object may also be achieved according to a tenth aspect of the invention, which provides a liquid crystal display device manufactured by using a scan-exposing device according to the ninth aspect of this invention described above.

According to one preferred form of the scan-exposing device of the ninth aspect of the invention, the photomask scan-exposing means is operable to expose the photoresist through the photomask to a ultraviolet radiation whose irradiation energy density is determined so as to remove only a portion of a thickness of the photoresist, and the spot scan-exposing means includes a spot scan-exposing optical system operable to expose the photoresist to a spot light of a condensed ultraviolet radiation, and wherein the photomask scan-exposing means and the spot scan-exposing means are operable in one of two modes: consisting of: a mode in which the spot scan-exposing means is operated after an operation of the photomask scan-exposing means; and a mode in which the spot scan-exposing means is operated to expose the photoresist in a direct direction while the photomask scan-exposing means is operated to expose the photoresist in the first direction, and the spot scan-exposing means is operated to expose the photoresist in a second direction perpendicular to the first direction after a photomask scan exposure of the photoresist by the photomask scan-exposing means is completed over an entire surface areas of the photoresist.

The first object indicated above may also be achieved according to an eleventh aspect of this invention, which provides a process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with the picture-element electrodes, and (g) thin-film transistor elements connected to the scanning lines and the image-signal wires, and wherein the scanning lines, the image-signal wires, the picture-element electrodes, the common electrodes and the thin-film transistor elements are provided on a surface of one of the pair of substrates which faces the layer of the liquid crystal composition, the process comprising:

a first photomasking step of forming a positive resist that covers portions of a semiconductor layer formed on the one substrate, which portions correspond to gate electrodes of the thin-film transistor elements and the common electrodes;

a second photomasking step of forming a positive resist that covers portions of the semiconductor layer which correspond to the thin-film semiconductor elements, and forming resist-free areas that cover portions of the semiconductor layer which correspond to a first connecting portion, a second connecting portion and a third connecting portion, the first connecting portion being provided to form first static-electricity protective transistor elements connecting the common electrodes and the scanning lines, the second connecting portion being provided to form second static-electricity protective transistor elements connecting the common electrodes and the image-signal wires, and the third connecting portion connecting the external scanning-line driver circuit and the scanning line terminal portions;

a third photomasking step of forming a positive resist that covers portions of the semiconductor layer which correspond to source electrodes and drain electrodes of the thin-film transistor elements, and the picture-elements electrodes; and a fourth photomasking step of forming a positive resist for forming contact holes of the scanning-line terminal portions and contact holes of image-signal wire terminal portions.

The first object may also be achieved according to a twelfth aspect of the invention, which provides a process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with the picture-element electrodes, and (g) thin-film transistor elements connected to the scanning lines and the image-signal wires, and wherein the scanning lines, the image-signal wires, the picture-element electrodes, the common electrodes and the thin-film transistor elements are provided on a surface of one of the pair of substrates which faces the layer of the liquid crystal composition, the process being characterized by comprising:

a first photomasking step of forming a positive resist that covers portions of a semiconductor layer formed on the one substrate, which portions correspond to gate electrodes of the thin-film transistor elements and the common electrodes;

a second photomasking step of forming a positive resist that covers portions of the semiconductor layer which correspond to the thin-film semiconductor elements, and forming resist-free areas that cover portions of the semiconductor layer which correspond to a first connecting portion, a second connecting portion and a third connecting portion, the first connecting portion being provided to form first static-electricity protective transistor elements connecting the common electrodes and the scanning lines, the second connecting portion being provided to form second static-electricity protective transistor elements connecting the common electrodes and the image-signal wires, and the third connecting portion connecting the external scanning-line driver circuit and the scanning line terminal portions;

a third photomasking step of forming a positive resist that covers portions of the semiconductor layer which correspond to source electrodes and drain electrodes of the thin-film transistor elements, and the picture-elements electrodes; and a passivation step of subjecting a back channel portion of each of the thin-film transistor elements to a plasma doping treatment with a $B_2H_6$ gas, and coating the back channel portion with a layer formed of one of BCB, polyphenyl silazane and an organic material by ink-jet coating or flexo graphic printing method.

While the concept of the present invention is similar to that disclosed in the above-identified publication JP-A-2000-066240 in that both of these concepts utilize the halftone exposure technique to reduce the required number of the photomask. However, the portions of the semiconductor layer on which the second positive resist portions having the second thickness smaller than the first thickness are formed according to the present invention are different from those according to the technique in JP-A-2000-066240.

In the process of manufacturing a liquid crystal display of transverse electric-field type according to the first aspect of the invention described above, the use of a single photomask permits removal of local portions of the semiconductor layer, so as to form the thin-film transistor elements, and formation of the first, second and third connecting portions on the substrate in question. Thus, the present process makes it possible to reduce the required number of photomasks, leading to an accordingly reduced cost of manufacture of the liquid crystal display device of transverse electric-field type. Further, the thin-film transistor elements of the display device manufactured in the present process has substantially no variation in the length of the channel portions of the thin-film transistor elements, which length determines the characteristic of the thin-film transistor elements. Accordingly, the present process permits mass production of the liquid crystal display with high stability. Although the dimensional accuracy of the thin-film transistor elements formed by removal of the local portion of the semiconductor layer according to the present process is more or less lower than that of the thin-film transistor elements formed in the process disclosed in JP-A-2000-066240, a variation in this dimensional accuracy will cause substantially no variation in the characteristic of the thin-film transistor elements, provided the semiconductor layer has a width dimension larger than that of the gate electrodes. The present process tends to suffer from a lower degree of dimensional accuracy of the first connecting portion provided to form the first static-electricity protective transistor elements connecting the common electrodes and the scanning lines, the second connecting portion provided to form the second static-electricity protective transistor elements connecting the common electrodes and the image-signal wires, and the third connecting portion connecting the external scanning-line driver circuit and the scanning-line terminal portions, than in the process disclosed in JP-A-2000-066240. However, a variation in the dimensional accuracy of the first, second and third connecting portions has substantially no adverse influence on the characteristic of the thin-film transistor elements.

In the process according to the second or third preferred form of the process of the first aspect of the invention described above, the halftone exposing step can be implemented without using a special photomask as used in the process disclosed in JP-A-2000-066240. While the conventional mass production of the liquid crystal display device using the halftone exposure requires the use of a photomask having a high degree of dimensional accuracy, the process according to the second or third preferred form of the process of the invention does not require the use of such a photomask to implement the halftone exposure, and therefore increases the freedom in the design of the photomask to be used, resulting in a considerable reduction in the cost of manufacture of the photomask.

In the process according to the third preferred form of the process of the first aspect of the invention described above, the first positive resist portions having the first thickness are formed with the fully light-shielding area of the photomask preventing the ultraviolet radiation from exposing the portions of the semiconductor layer which correspond to the thin-film transistor elements, and the second positive resist portions having the second thickness smaller than the first thickness are formed with the fully light-transmitting area of the photomask permitting the ultraviolet radiation to expose the other portions of the semiconductor layer, while at the same time the resist-free areas are formed by exposing portions of the photoresist covering the portions of the semiconductor layer corresponding to the first, second and third connecting portions, to the respective spot lights of the condensed ultraviolet radiation. This process permits efficient formation of the first and second positive resist portions having the respective first and second thickness values and the resist-free areas, resulting in a significant improvement in the efficiency of manufacture of the liquid crystal display device.

The liquid crystal display device of transverse electric-field type according to the second aspect of this invention described above is manufactured by the process according to the first aspect of the invention, which requires the use of a single photomask as described above. Accordingly, the present liquid crystal display device is available at a relatively low cost.

In the preferred form of the second aspect of the invention described above, the width of the third connecting portion is made larger than those of the first and second connecting portions, so that the contact resistance at the third connecting portion connecting the external scanning-line driver circuit and the scanning-line terminal portions can be lowered to minimize a variation in the horizontal stripes on the screen of the display device.

In the scan-exposing device according to the third aspect of this invention described above, the film-thickness measuring device is provided to measure the actual value of the second thickness of the second positive resist portions formed in the halftone exposing step, and the amount of exposure of the photoresist to the radiation is feedback-controlled by the feedback control device, depending upon the actual value of the second thickness of the second positive resist portions measured by the film-thickness measuring device. In the process of manufacturing a liquid crystal display device of transverse electric-field type according to the first aspect of this invention, the present scan-exposing device permits easy formation of the first and second positive resist portions having the different first and second thickness values, while minimizing a variation in the thickness values which would otherwise be inherent to the halftone exposing sep, so that the liquid crystal display device can be mass-produced with a high degree of stability. Where the scan-exposing device is of a multiple-lens projection exposing type as shown in FIGS. 17 and 18 and as described below, the amount of exposure of the photoresist to a ultraviolet radiation can be easily adjusted owing to a bundle of quartz fibers extending from a light source. In the halftone exposing step, the uniformity of the amount of exposure of the photoresist to the ultraviolet radiation is particularly important. A variation in the thickness of the positive resist portions which have been halftone-exposed and developed prevents mass production of the liquid crystal display device. In this respect, the yield ratio of the display device is appreciably improved by controlling the distribution and amount of exposure of the photoresist to the ultraviolet radiation for each of the substrates on the basis of the actual values of the thicknesses of the positive resist portions accurately measured by the film-thickness measuring device.

In the scan-exposing device according to the fourth aspect of the invention described above, the white light interferometer is provided to measure at least one of the difference between the actual values of the first and second thicknesses of the first and second positive resist portions formed in the halftone exposing step, and the actual value of the second thickness of the second positive resist portions with respect to the resist-free areas. The amount of exposure of the photoresist to the radiation is feedback-controlled by the feedback control device, depending upon the above-indicated difference and/or the actual value of the second thickness which has been measured by the white light interferometer. In the process of manufacturing a liquid crystal display device of transverse electric-field type according to the first aspect of this invention, the present scan-exposing device permits easy formation of the first and second positive resist portions having the different first and second thickness values, while minimizing a variation in the thickness values which would otherwise be inherent to the halftone exposing sep, so that the liquid crystal display device can be mass-produced with a high degree of stability. Where the scan-exposing device is of a multiple-lens projection exposing type as shown in FIGS. 17 and 18 and as described below, the amount of exposure of the photoresist to a ultraviolet radiation can be easily adjusted owing to a bundle of quartz fibers extending from a light source. In the halftone exposing step, the uniformity of the amount of exposure of the photoresist to the ultraviolet radiation is particularly important. A variation in the thickness of the positive resist portions which have been halftone-exposed and developed prevents mass production of the liquid crystal display device. In this respect, the yield ratio of the display device is appreciably improved by controlling the distribution and amount of exposure of the photoresist to the ultraviolet radiation for each of the substrates on the basis of the actual values of the thicknesses of the positive resist portions accurately measured by the white light interferometer.

In the scan-exposing device according to the fifth aspect of the invention described above, the quartz photomask substrate has the desired light-shielding pattern, and the at least one Bernoulli chuck of non-contact type is disposed so as to be opposed to one of opposite surfaces of the above-indicated one substrate upon which the ultraviolet radiation is incident. The at least one Bernoulli chuck is operable to reduce the amount of deflection of the quartz photomask substrate due to its own weight while the quartz photomask substrate is placed in the horizontally extending position. Further, the laser displacement meter is provided to measure the amount of displacement of the above-indicated one of opposite surfaces of the quartz photomask substrate in a vertical direction. While the photoresist on the substrate in question is scan-exposed to the ultraviolet radiation through the quartz photomask substrate, the at least one Bernoulli chuck is controlled by the substrate-position control device, on the basis of the amount of vertical displacement measured by the laser displacement meter. Thus, the present scan-exposing device permits scan-exposure of the photoresist while the quartz photomask substrate is held substantially flat extending in the horizontal direction, with the amount of deflection of the quartz photomask substrate being reduced by the at least one Bernoulli chuck. Where the quartz photomask substrate is large-sized, the photoresist scan-exposed by the conventional scan-exposing device undesirably has under-focused and over-focused local portions due to a relatively large amount of deflection of the quartz photomask substrate cased by its own weight, resulting in a low degree of uniformity of resolution of exposure and development of the photoresist. To the contrary, the scan-exposing device according to the present fifth aspect of the invention assures a significant improvement in the uniformity of resolution in the exposure and development of the photoresist. While two or more quartz photomask substrates of a relatively small size may be jointed into a single large-sized quartz photomask substrate to be used for the exposure, this approach suffers from a problem caused visible junctions between the small-sized substrates, and a problem of difficulty to design the junctions. The scan-exposing device according to the present fifth aspect of the invention makes it possible to achieve the san exposure by using a single quartz photomask substrate.

The liquid crystal display device of transverse electric-field type according to the sixth aspect of the invention described above is manufactured by using the scan-exposing device according to the fifth aspect of the invention, which permits easy scan exposure of the photoresist using a large-sized quartz photomask substrate, and assures an accordingly reduced cost of manufacture of the liquid crystal display device. The present liquid crystal display device has a high degree of uniformity in its resolution, since the scan-exposing device used to manufacture the display device is effective to minimize the under-focused and over-focused portions of the photoresist, which would reduce the uniformity in the resolution.

In the scan-exposing device according to the seventh aspect of the invention described above, the quartz substrate disposed in opposition to the quartz photomask substrate having the desired light-shielding patter, such that the quartz substrate cooperates with the quartz photomask substrate to define therebetween an air-tight space, and the pressure sensor is provided to detect a pressure within the air-tight space. The difference between the pressure within the air-tight space and an atmospheric pressure is controlled by the pressure control device such that the pressure within the air-tight space is lower than the atmospheric pressure by the controlled difference so as to reduce the amount of deflection of the quartz photomask substrate due to its own weight, while the photoresist is scan-exposed through the quartz photomask substrate. The present scan-exposing device permits easy scan exposure of the photoresist by using a single large-sized quartz photomask substrate, and makes it possible to minimize the deterioration of the uniformity in the resolution of patterning of the photoresist due to the under-focused and over-focused portions.

The liquid crystal display device of transverse electric-field type according to the eighth aspect of the invention described above is manufactured by using the scan-exposing device according to the seventh aspect of the invention, which permits easy scan exposure of the photoresist using a large-sized quartz photomask substrate, and assures an accordingly reduced cost of manufacture of the liquid crystal display device. The present liquid crystal display device has a high degree of uniformity in its resolution, since the scan-exposing device used to manufacture the display device is effective to minimize the under-focused and over-focused portions of the photoresist, which would reduce the uniformity in the resolution.

The scan-exposing device according to the ninth aspect of this invention described above is used in a process of manufacturing a liquid crystal display device including a pair of substrates at least one of which is transparent, and a layer of a liquid crystal composition interposed between the pair of substrates. This scan-exposing device includes the slide carrying the above-indicated one of the pair of substrates, the photomask scan-exposing means for scan-exposing the photoresist while the photomask and the slide are moved at a same speed in a same direction, and the spot scan-exposing means for directly spot scan-exposing the photoresist without using the photomask, with a spot size ranging from about 0.1mm to about 0.5mm. In the present scan-exposing device, the photomask scan-exposing means and the spot scan-exposing means are operable concurrently to expose the photoresist. The present scan-exposing device permits simultaneous formation of first resist portions having a first thickness, second resist portions having a second thickness, and resist-free areas, by scan-exposing the photoresist, thereby significantly improving the efficiency of manufacture of the liquid crystal display device. Since the scan-exposing device incorporates both of the photomask scan-exposing means and the spot scan-exposing means, the required number of exposing devices can be reduced, making it possible to reduce the required area of a clean room accommodating the exposing devices, leading to a considerable increase in the efficiency of investment.

The liquid crystal display device of transverse electric-field type according to the tenth aspect of the invention described above is manufactured by using the scan-exposing device according to the ninth aspect of the invention, which permits efficient and economical manufacture of the liquid crystal display device.

In the scan-exposing device according to the preferred form of the ninth aspect of the invention described above, the photoresist is first exposed by the photomask scan-exposing means using the photomask and the ultraviolet radiation whose irradiation energy density is reduced, and is then exposed by the spot scan-exposing means. The photomask scan exposure of the photoresist by the photomask scan-exposing means requires the photoresist patterning resolution of about 3 μm–10 μm, while the spot scan exposure by the spot scan-exposing means requires the resolution of as low as about 100 μm. Therefore, the yield ratio of the liquid crystal display device can be improved by implementing the photomask scan exposure requiring the higher photoresist patterning resolution, before dust is deposited on the substrate (glass substrate) carrying the photoresist, namely, before the spot scan exposure, and then implementing the spot scan exposure by the spot scan-exposing means, in which the dust does not have a significant influence on the patterning of the photoresist.

In the process of manufacturing the liquid crystal display device according to the eleventh aspect of the present invention described above, the manufacture of the liquid crystal display device of transverse electric-field type requires only four photomasking steps, and a relatively small number of photomasks. Accordingly, the present process permits economical manufacture of the liquid crystal display device.

In the process of manufacturing the liquid crystal display device according to the twelfth aspect of this invention described above, the manufacture of the liquid crystal display device of transverse electric-field type requires only three photomasking steps, and a relatively small number of photomasks. Accordingly, the present process permits economical manufacture of the liquid crystal display device.

The process according to the eleventh or twelfth aspect of the invention permits economical manufacture of the liquid crystal display device of active matrix type with a high yield ratio, and with a high degree of consistency in the characteristic of the thin-film transistor elements. In addition, static-electricity protective circuits for protecting active matrix elements against static electricity generated in the process of manufacture of the liquid crystal display device can be incorporated within the interior of the active matrix substrate, so that the process of manufacture can be easily controlled so as to minimize a risk of defects of the display device.

The process according to the first aspect, eleventh aspect or twelfth aspect of the invention permits manufacture of the liquid crystal display device, without using transparent conductive films. Further, the present process permits the use of metallic materials, metal silicide compounds or metal nitride, as the materials of the electrodes, so that the cost of sputtering targets for the electrodes can be reduced. Similarly, all of the static-electricity protective transistor circuits formed on the active matrix substrate may be formed of metallic materials, metal silicide compounds or metal nitride, a relatively large amount of electric current can be applied to the static-electricity protective transistor circuits. This aspect is particularly important in the process of manufacture of a liquid crystal display device of a 40-inch or larger size. Namely, the production line for the display device is not required to comply with a static electricity protection standard which is severer than the conventional standard, so that the feeding speed of the substrate need not be reduced. An increase in the feeding speed of the substrate permits an accordingly improved efficiency of manufacture and an increased yield ratio of the display device.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 11A through FIG. 11F are elevational views in cross section of an active matrix substrate, explaining a halftone exposing step according to the first embodiment;

FIG. 24 is an elevational view in cross section of a scan-exposing step used to effect a halftone exposing step according to a sixth embodiment of the invention.

DETAILED DESCRIPTION OF THE PREFERRED EMBODIMENTS

Figure 1:
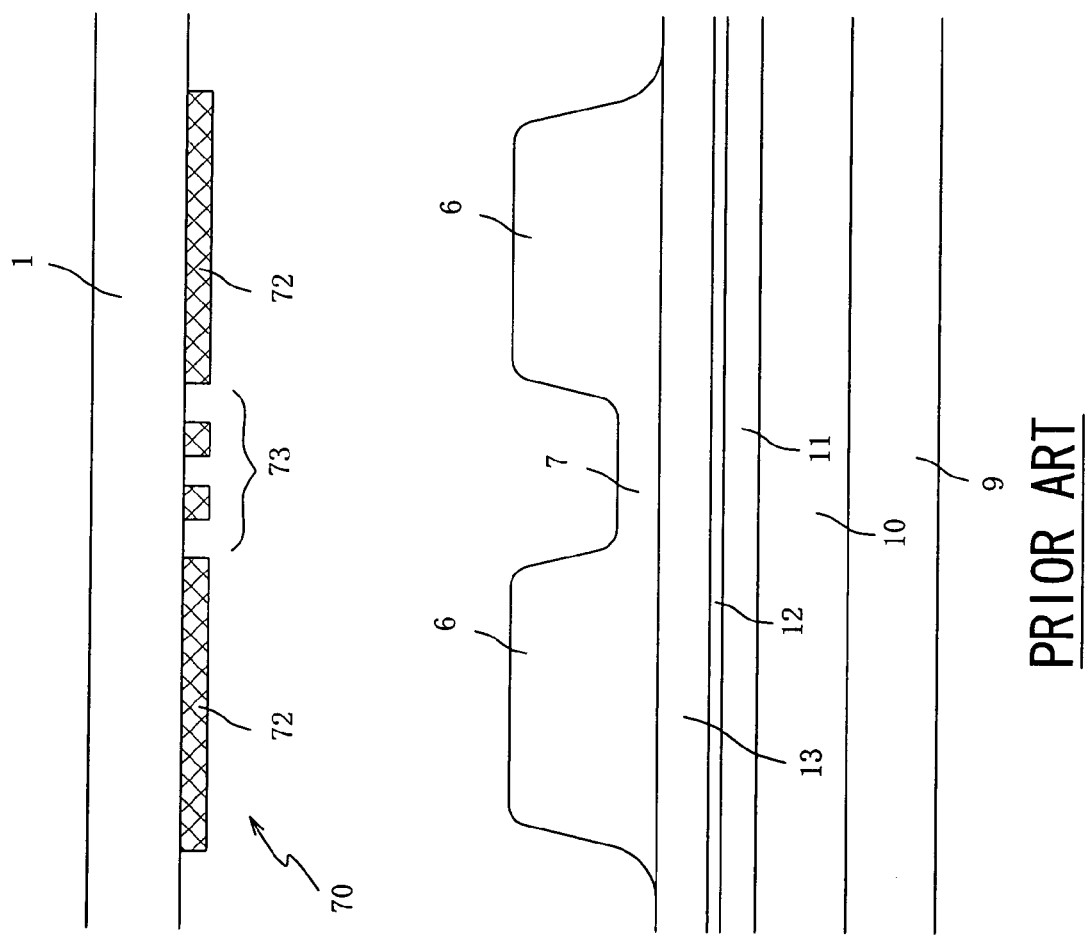
FIG. 1 is an elevational view in cross section showing a halftone photomask and a photoresist layer after development, in the prior art.
Figure 2:
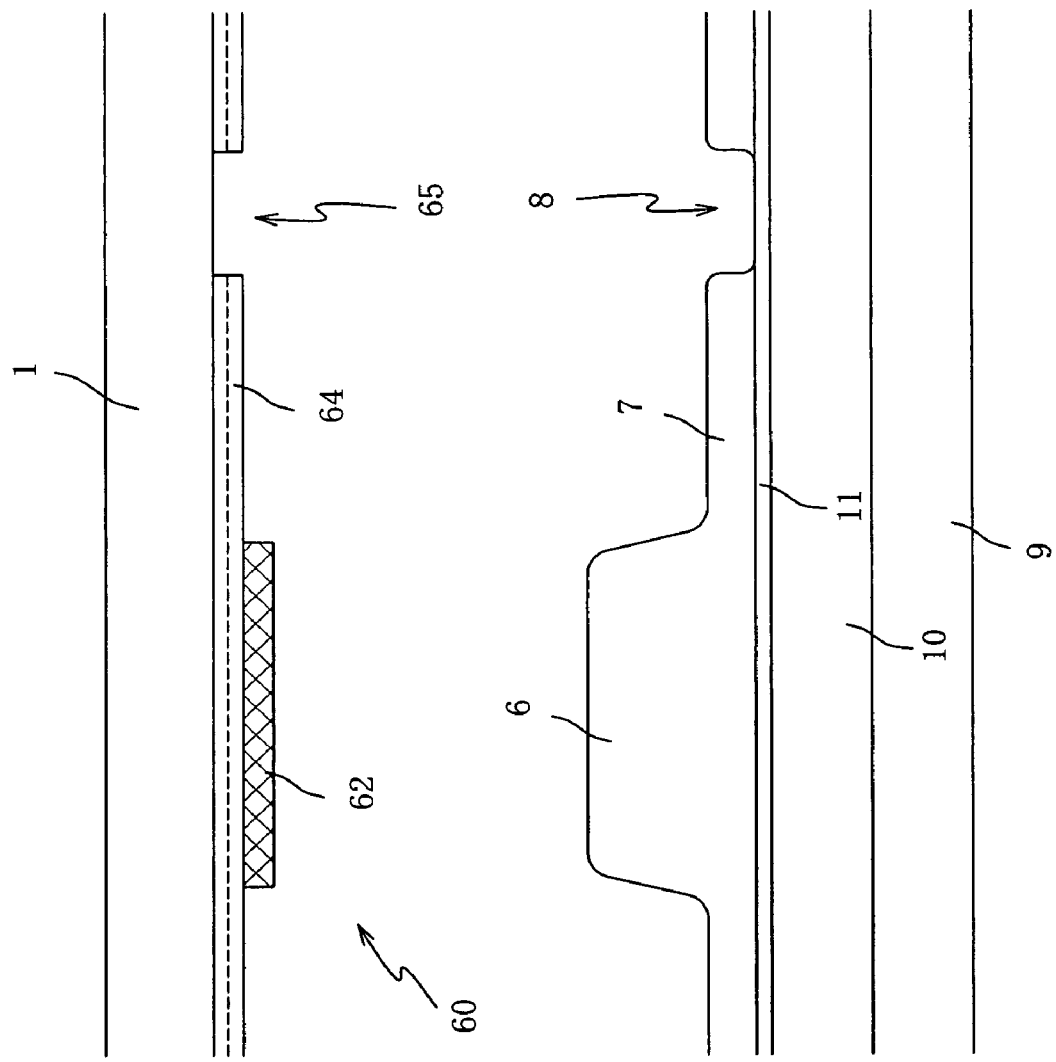
FIG. 2 is an elevational view in cross section showing a halftone photomask and a photoresist layer after development, according to a first embodiment of the present invention.

A first embodiment of this invention will be described. In the first embodiment, a halftone photomask 60 as shown in the cross sectional view of FIG. 1 is used in a halftone exposing step. The halftone photomask 60 includes a photomask substrate 1 (quartz glass), and a photomask metal 62 and a semi-light-transmitting portion 64 which are formed on the substrate 1. The photomask metal 62 provides the halftone photomask 60 with a fully light-shielding area (fully light-blocking area), while a portion of the semi-light-transmitting portion 64 which is not held in contact with the photomask metal 62 provides the halftone photomask 60 with a semi-light-transmitting area. The halftone photomask 60 has a fully light-transmitting area 65 in which the semi-light-transmitting portion 64 is not formed.

Figure 7:
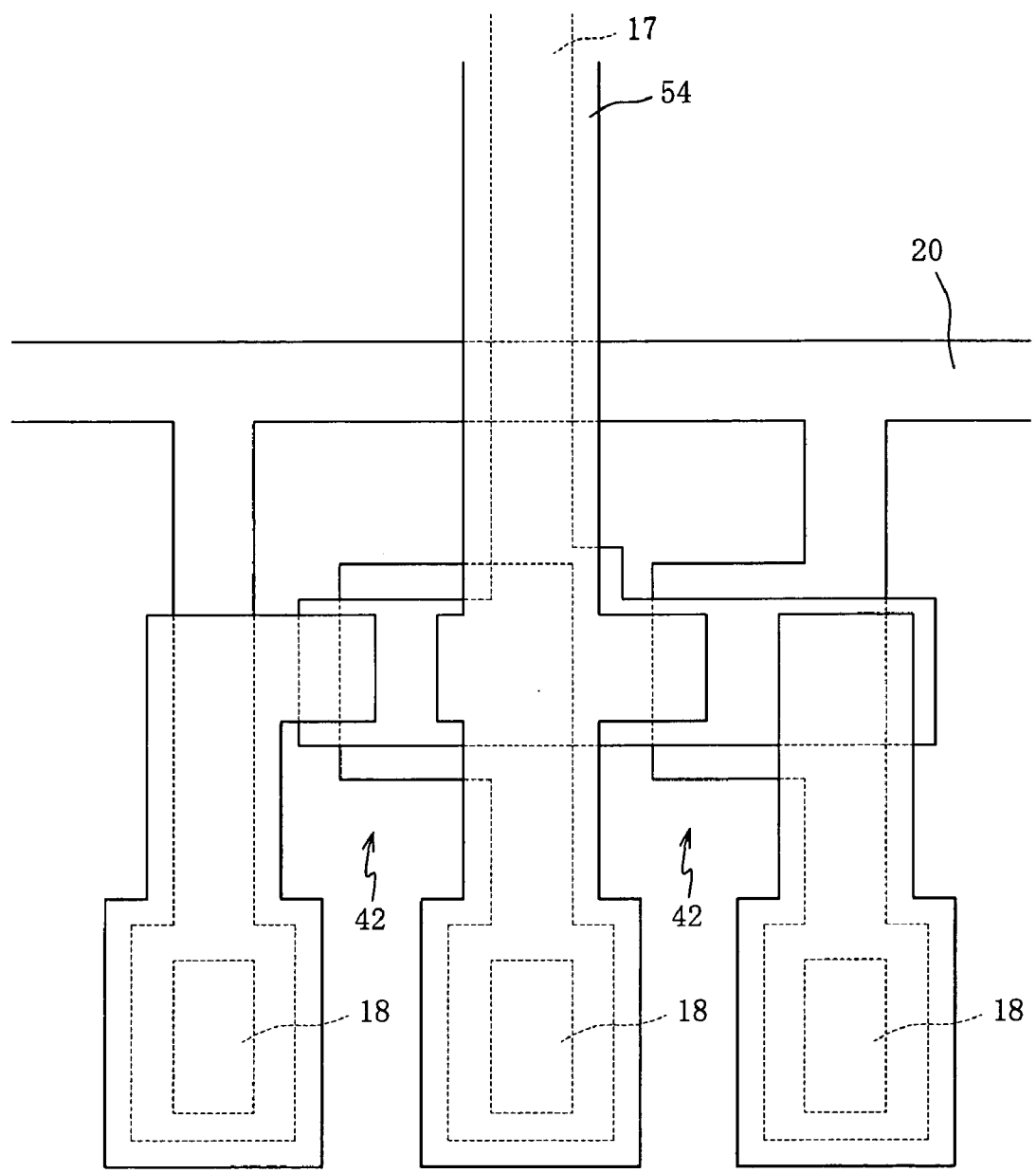
FIG. 7 is a plan view of a static-electricity protective transistor element according to the present invention.
Figure 8:
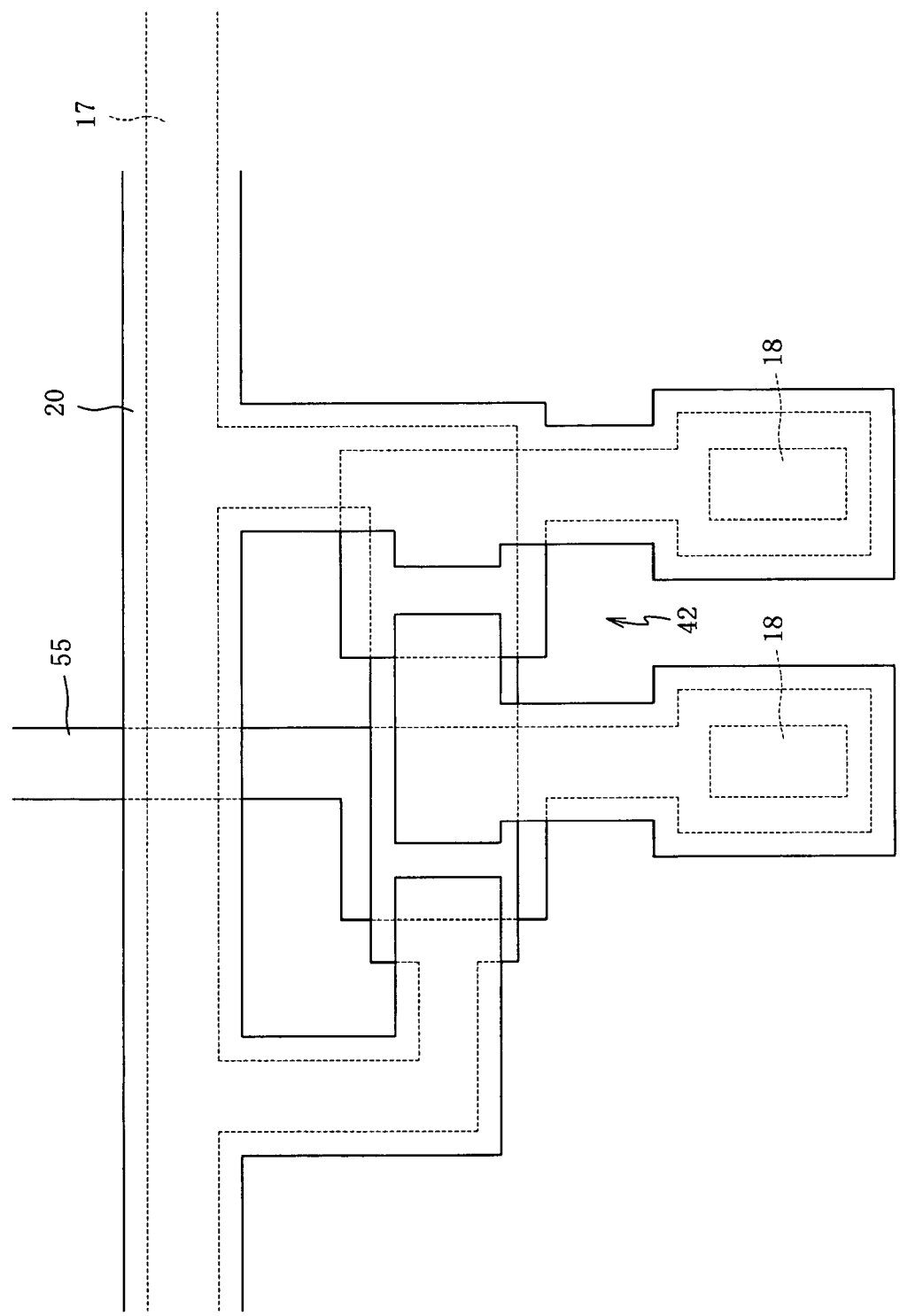
FIG. 8 is a plan view of a static-electricity protective transistor element according to the present invention.
Figure 9:
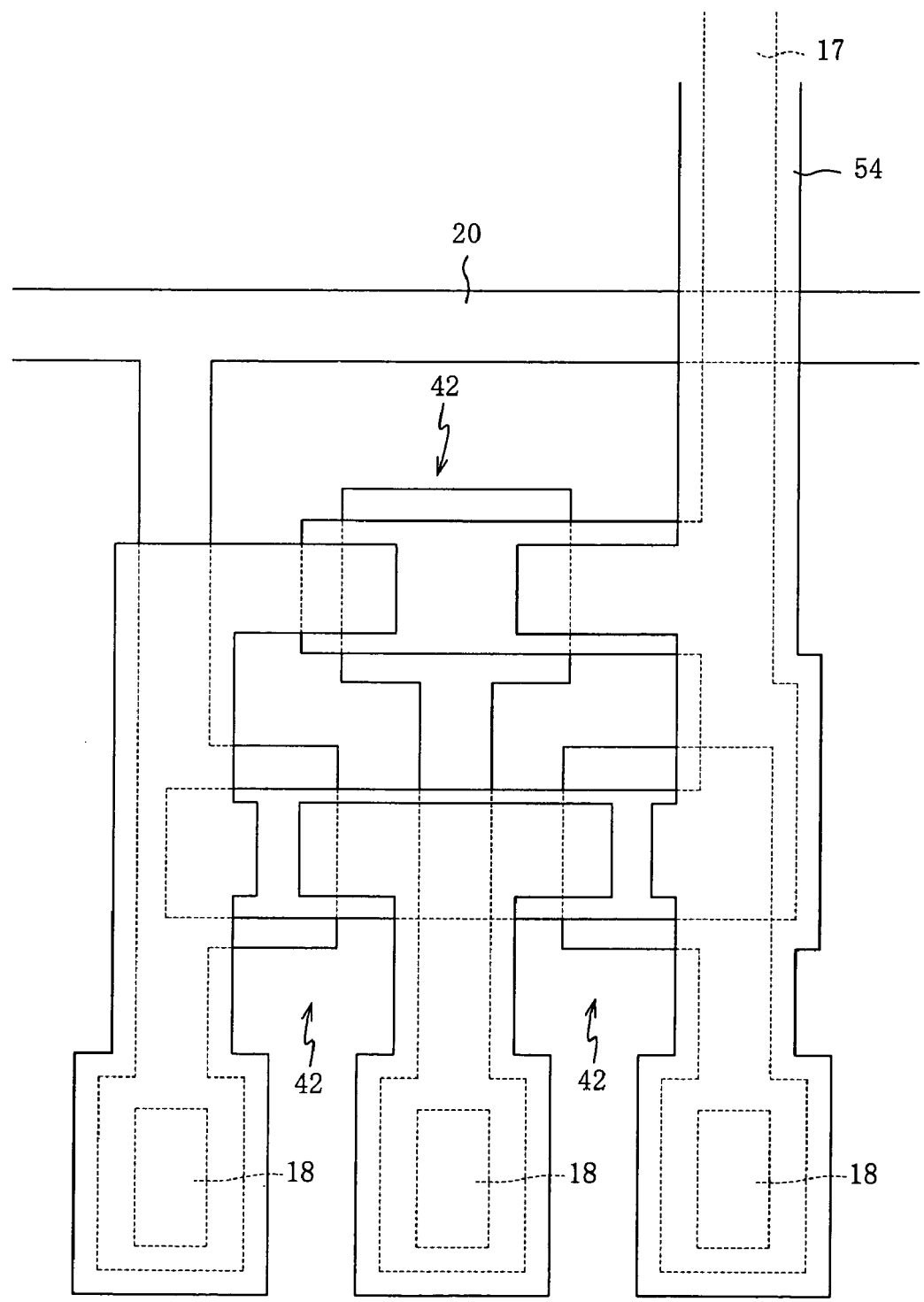
FIG. 9 is a plan view of a static-electricity protective transistor element according to the present invention.
Figure 10:
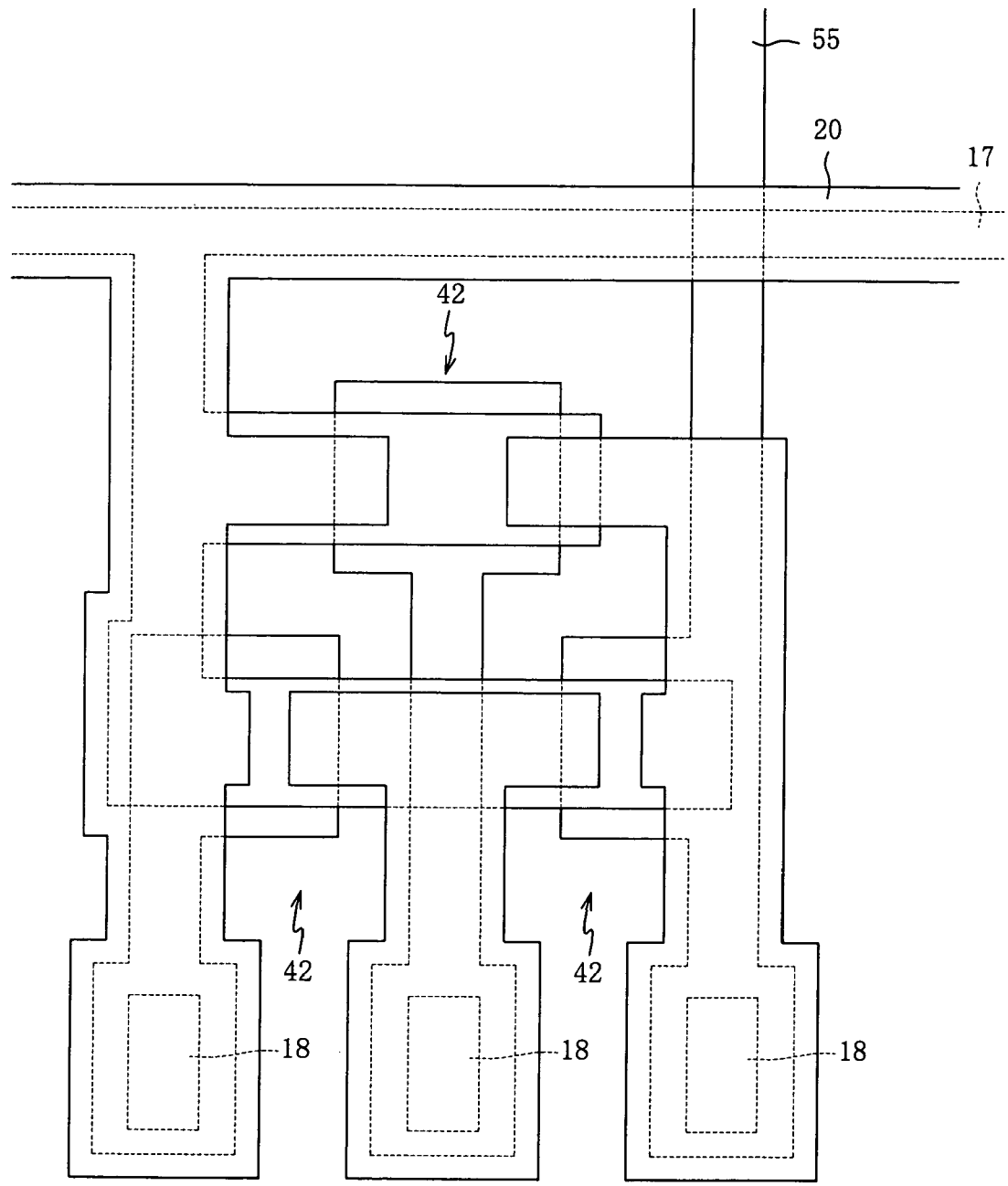
FIG. 10 is a plan view of a static-electricity protective transistor element according to the present invention.

There will next be described the halftone exposing step. FIGS. 11A through 11B are cross sectional views of an active matrix substrate, for explaining the halftone exposing step. FIG. 11A shows a resist pattern formed on the active matrix substrate 9, by using the halftone photomask 60 described above. This resist pattern includes a positive resist portion 6 which has a predetermined first thickness and which is prevented by the fully light-shielding area of the halftone photomask 60 from being exposed to a ultraviolet radiation. This positive resist portion 6 covers a portion of the active matrix substrate 9 at which a thin-film transistor element 58 is formed so as to be superposed on a gate electrode 55. The resist pattern further has a resist-free area 8 which is not provided with any positive resist portion and which corresponds to the fully light-transmitting area 65 of the halftone photomask 60 that permits full transmission of the ultraviolet radiation therethrough. This resist-free area 8 covers a portion of the active matrix substrate 9 at which there is formed a third connecting portion in the form of a contact hole 59 which connects an external scanning-line driver circuit (not shown) and a scanning-line terminal portion 19 through a junction electrode 21. The resist pattern formed in the step shown in FIG. 11A further has other resist-free areas covering a first connecting portion and a connecting portion in the form of contact holes 18 (shown in FIG. 7) for forming static-electricity protective transistor elements 42 (shown in FIG. 7). As also shown in FIG. 11A, the resist pattern further includes a positive resist portion 7 which has a second thickness smaller than the first thickness of the positive resist portion 6 and which is the portion other than the positive resist portion 6 and the resist-free area 8.

Then, the active matrix substrate 9 is subjected to an etching operation, so as to remove portions of semiconductor layers 10, 11, a barrier metal layer 12 and a low-resistance metal layer 13, which portions correspond to the resist-free area 8 of the resist pattern. As a result, the contact hole 59 is formed. Subsequently, the resist pattern is entirely subjected to an ashing operation, for example, to remove the positive resist portion 7 having the second thickness. FIG. 11B shows the active matrix substrate 9 after the etching and ashing operations.

Then, the substrate 9 is subjected to an etching operation, to remove portions of the semiconductor layers 10, 11, barrier metal layer 12 and low-resistance metal layer 13, which portions are not covered by the positive resist portion 6. As a result, the portions of the semiconductor layers 10, 11 which are left are formed into semiconductor elements. FIG. 11C shows the step in which the semiconductor layers 10, 11 on the active matrix substrate 9 are formed into the semiconductor elements.

Figure 3:
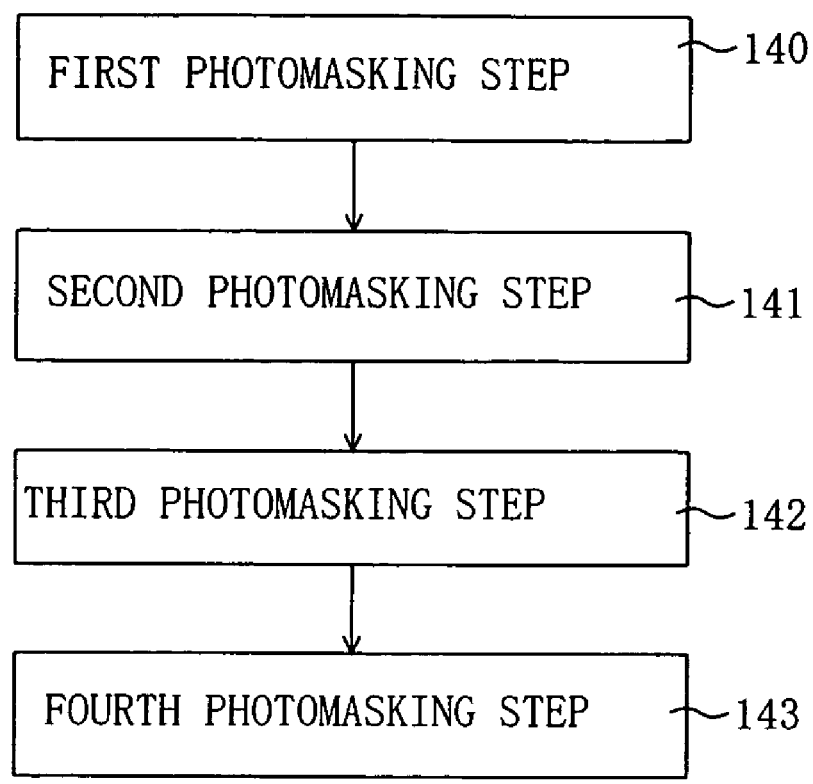
FIG. 3 is a flow chart illustrating a photomasking process according to the first embodiment.
Figure 16:
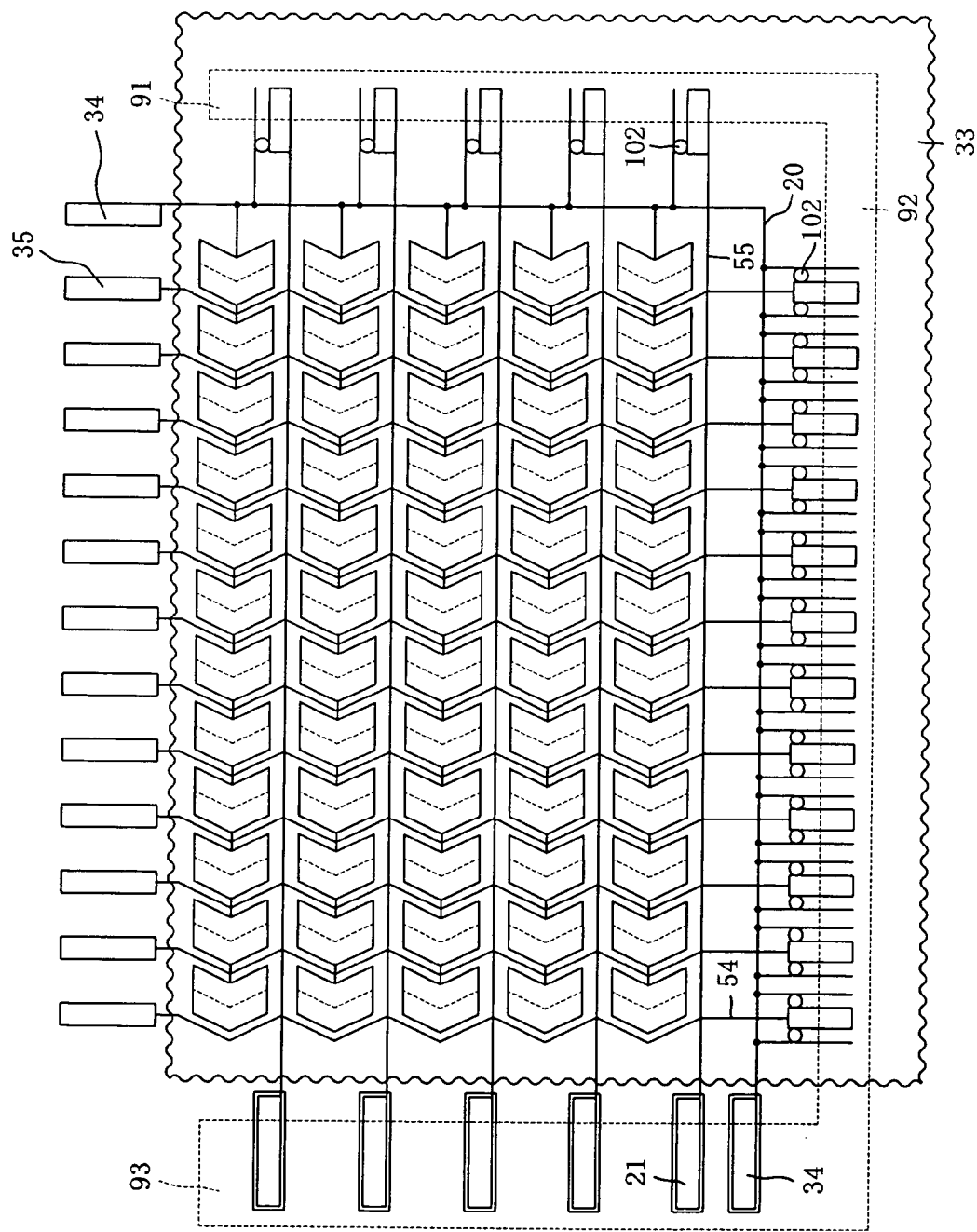
FIG. 16 is a plan view of an active matrix substrate of transverse electric-field type produced in the halftone exposing step according to the second embodiment.

Referring next to the flow chart of FIG. 3, there is illustrated a photomasking process performed in a process of manufacturing a liquid crystal display device of transverse electric-field type according to the first embodiment of the invention. In a first photomasking step 140, a positive resist is first formed on portions of the substrate 9 which correspond to the gate electrode 55 and a common electrode 20. In a second photomasking step 141, the positive resist portion 6 is formed on a portion of the substrate 9 corresponding to the thin-film transistor element 58, and the resist-free area 8 are formed on portions of the substrate 9 which correspond to the contact holes 18, 59, while the positive resist portion 7 is formed on the other portion of the substrate 9. The second photomasking step 141 is a halftone exposing step according to the present invention. In a third photomasking step 142, a positive resist is formed on portions of the substrate 9 which correspond to a source electrode 54, a drain electrode 56 and a picture-element electrode 22. In a fourth photomasking step 143, a positive resist is formed for forming a contact hole 24 at the scanning-line terminal portion 19 shown in FIG. 11F, and contact holes at image-signal-wire terminal portions 34 (FIG. 16).

Figure 5:
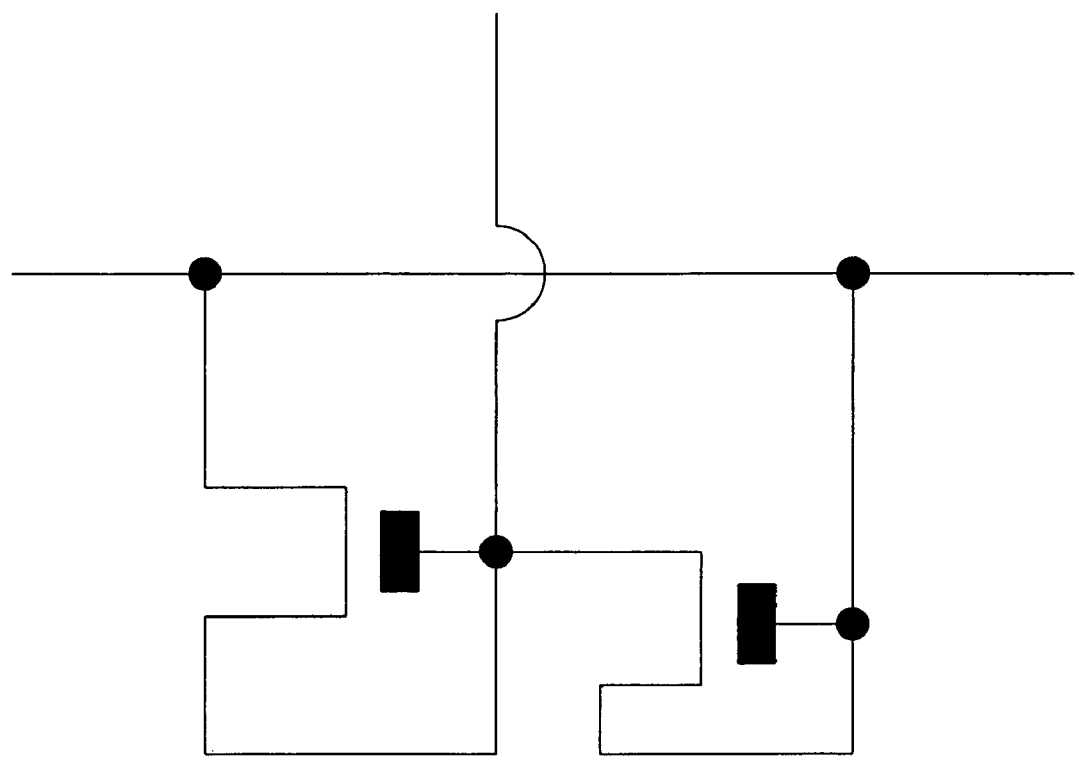
FIG. 5 is a circuit diagram depicting a static-electricity protective transistor element according to the present invention.
Figure 6:
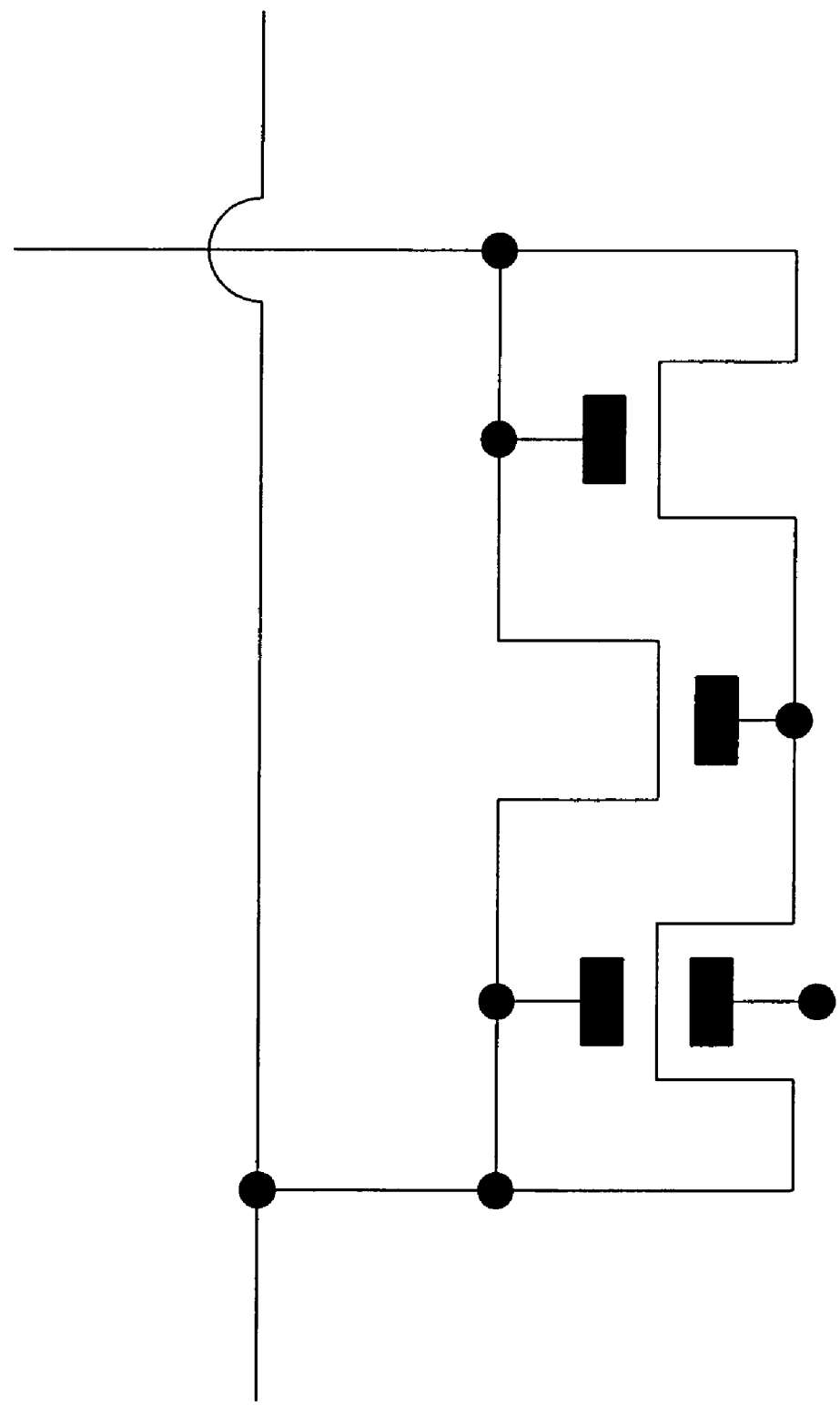
FIG. 6 is a circuit diagram depicting a static-electricity protective transistor element according to the invention.

Referring to the circuit diagrams of FIGS. 5 and 6, there are shown circuits of the static-electricity protective transistor elements 42 used in the present invention. However, these circuits may be replaced by any other circuits, depending upon the desired function of the circuits. The plan views of FIGS. 7–10 show the circuits of the static-electricity protective transistor elements 42 formed in the process of the invention.

Figure 22:
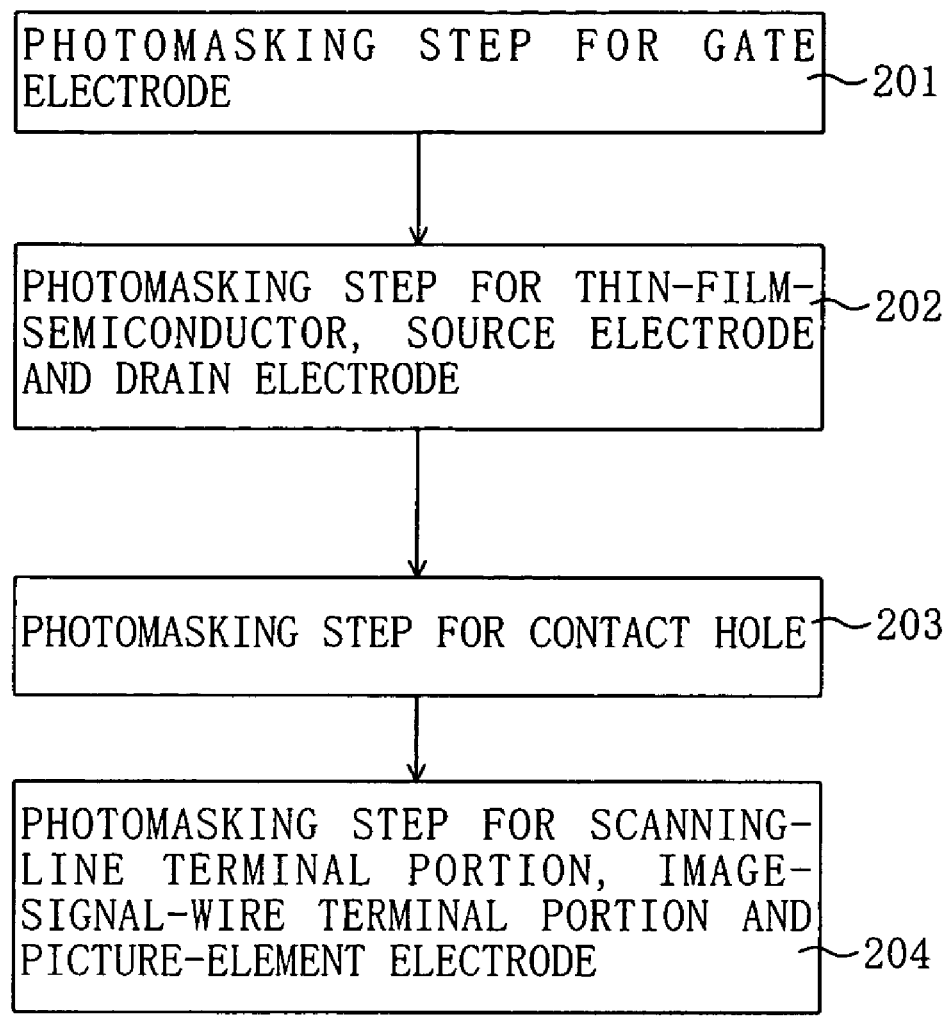
FIG. 22 is a flow chart illustrating a photomasking process utilizing a conventional halftone exposing step.

In the conventional halftone exposing step disclosed in JP-A-2000-066240 uses the slit type photomask 70 as shown in FIG. 1. The slit type photomask 70 has a photomask metal 72, and a slit area having slits 73 which are formed so as to reduce the average amount of transmission of ultraviolet radiation through the slit area, so that a portion of the substrate 9 at which the channel portion of the thin-film transistor element is to be formed is provided with a positive resist portion having a smaller thickness than a positive resist portion formed at a portion of the substrate 9 which corresponds to the photomask metal 72. Thus, the use of the single photomask 70 permits formation of the semiconductor layers 10, 11 into semiconductor elements, and formation of the channel portion of the thin-film transistor element. In the prior art disclosed in JP-A-2000-066240, the active matrix substrate 9 is manufactured in a photomasking process illustrated in the flow chart of FIG. 22. However, the conventional photomasking process according to JP-A-2000-066240 suffers from a low degree of accuracy in the length of the channel portion, giving rise to a problem of a relatively large amount of variation in the characteristic of the thin-film transistor element.

Unlike the technique disclosed in JP-A-2000-066240, the process according to the present embodiment is not formulated to form the channel portion of the thin-film transistor element in the halftone exposing step. In the present first embodiment, the channel portion 57 of the thin-film transistor element 58 is formed in the step of FIG. 11D, only after the semiconductor layers 10, 11 are formed into the semiconductor elements in the step of FIG. 11C. Therefore, the present process suffers from substantially no variation in the length of the channel portion 57 of the thin-film transistor element 58, and an extremely small amount of variation in the surface area at the portion of overlapping of the gate electrode 55, source electrode 54 and drain electrode 56. Accordingly, the present process makes it possible to minimize the amount of variation in the characteristic of the thin-film transistor element 58, assuring stable mass production of a product including the thin-film transistor element 58.

In the present first embodiment illustrated in FIGS. 11A–11F, the active matrix substrate 9 can be manufactured by using metallic materials for forming two kinds of electrodes for the scanning lines and the image-signal wires, so that the cost of manufacture of the substrate 9 can be reduced. Although the substrate 9 subjected to the halftone exposing step may have a variation in its dimensional accuracy, this variation which may occur in the first embodiment does not have an adverse influence on the characteristic of the thin-film transistor element, making it possible to prevent reduction in the yield ratio of a liquid crystal display device manufactured in the present process, even if the display device has a large-sized screen. Further, the common electrode 20 and the picture-element electrode 22 are entirely covered by a passivation film 23, as shown in FIG. 11E, making it possible to minimize generation of an after-image phenomenon.

Figure 21:
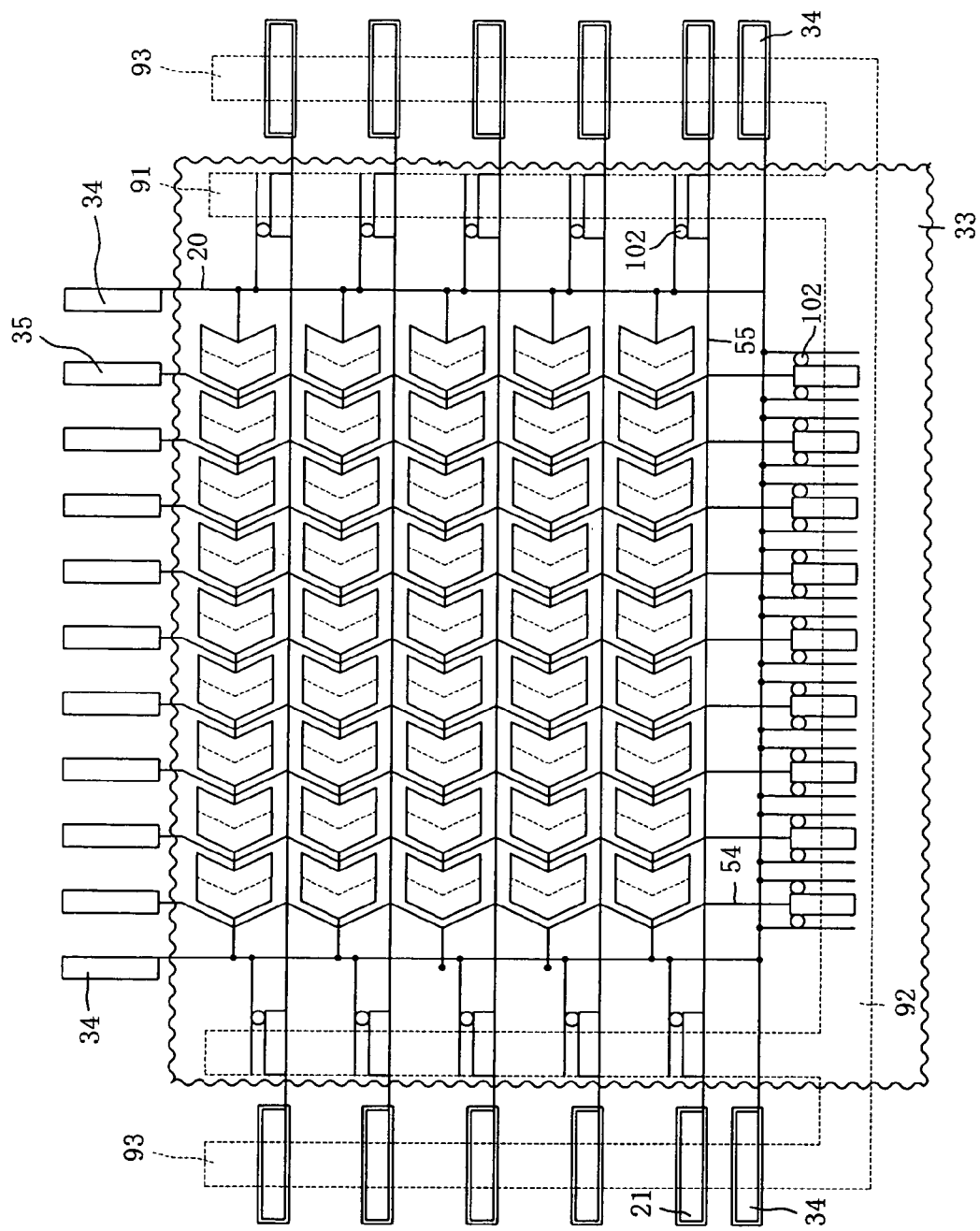
FIG. 21 is a plane view of an active matrix substrate of transverse electric-field type produced in the halftone exposing step according to the second embodiment.

There will be described a second embodiment of this invention. Aspects of the second embodiment which are similar to those of the first embodiment will not be described. The plan views of FIGS. 16 and 21 show active matrix substrates of transverse electric-field type manufactured by a process of manufacture according to the present second embodiment. The second embodiment does not use the slit type photomask 70 shown in FIG. 1, or the halftone photomask 6 used in the first embodiment.

Figure 12A:
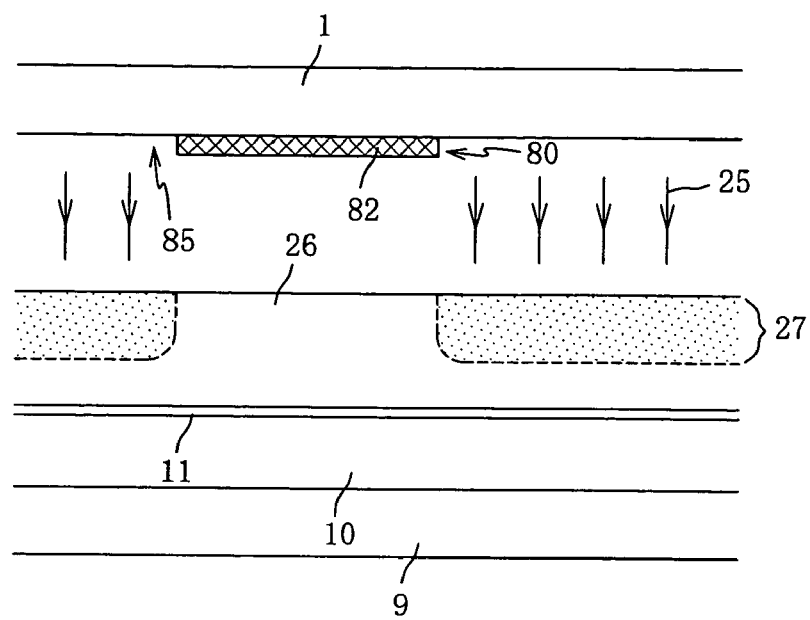
FIGS. 12A, 12B and 12C are elevational views in cross section showing a combination exposure process and a photoresist layer after the development, according to a second embodiment of the invention
Figure 12B:
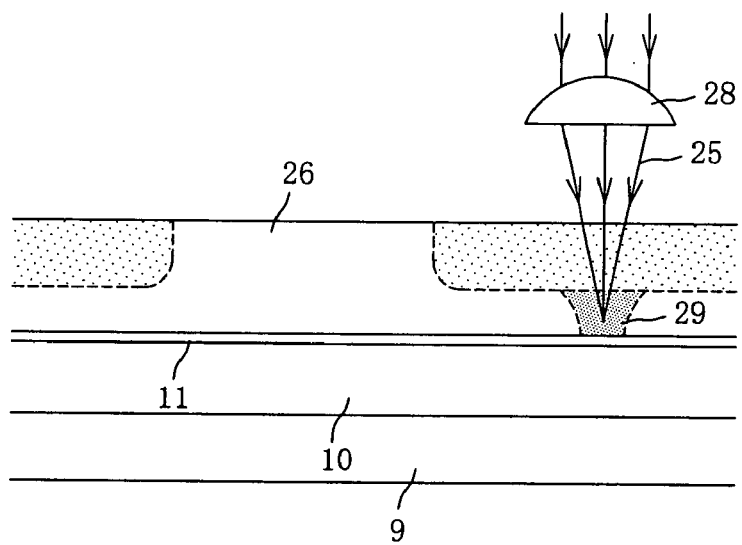
Figure 12C:
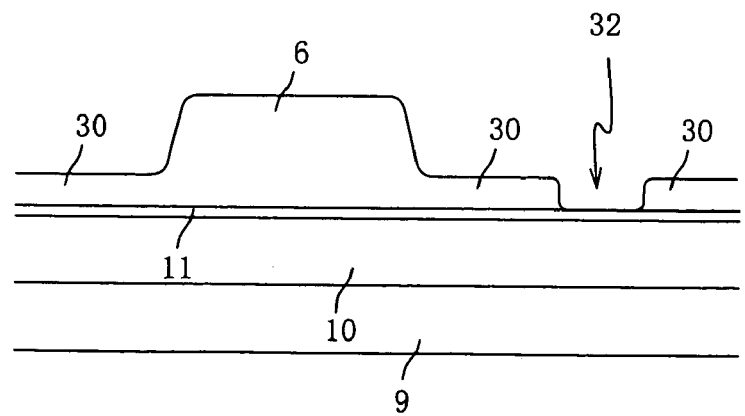

A halftone exposing step in the second embodiment will be described. The cross sectional views of FIGS. 12A, 12B and 12C show the active matrix substrate 9, for explaining the halftone exposing step. The active matrix substrate 9 is exposed to a ultraviolet radiation 25 through a photomask 80 shown in FIG. 12A. The photomask 80 includes a photomask metal 82 formed on the photomask substrate 1. The irradiation energy density of the ultraviolet radiation 25 is lowered than in an ordinary exposing step, so that only a portion of the thickness of a photoresist exposed to the ultraviolet radiation 25 is removed. The photomask metal 82 which functions as a fully light-shielding area contains Cr or Mo, and the photomask substrate 1 has a fully light-transmitting area 85. FIG. 12A shows a non-exposed portion 26 of the photoresist which corresponds to the photomask metal 82, and an exposed portion 27 of the photoresist which corresponds to the fully light-transmitting area 85.

In the next step shown in FIG. 12B, an area 29 of the exposed portion 27 in which contact grooves 91, 92, 93 (which will be described by reference to FIGS. 13, 14 and 16) are to be formed is exposed to the ultraviolet radiation 25 which has been condensed by spot scan-exposing means in the form of a UV condenser lens 28. As a result, the area 29 of the exposed portion 27 of the positive resist is removed, and the substrate 9 is provided with a resist-free area 32 for the contact grooves 91-93, as shown in FIG. 12C and FIG. 15A.

FIG. 12C shows the positive resist 6 after the development following the exposure in the two steps shown in FIGS. 12A and 12B. These two steps, namely, overall photomask scan exposure of the substrate 9 to the ultraviolet radiation whose irradiation energy density is lowered as described above, and spot scan exposure of the area 29 to spot lights of the condensed ultraviolet radiation 25 may be implemented by respective different devices. However, the halftone exposing process may be implemented by a single device such as scan-exposing devices 100, 110, 120, 130, which will be described.

In the second embodiment described above, the ultraviolet radiation 25 is condensed into a spot light for irradiating the area 29 of the positive resist to form the resist-free area 32 of the substrate 9. However, another photomask other than the photomask 80 may be used to expose the substrate 9, so as to form the resist-free area 32. In this case, the exposure must be conducted by using the two photomasks, so that the required exposure time is undesirably increased due to a change of the photomask. Nevertheless, this alternative exposure method is suitable where the substrate 9 is provided with a large number of contact holes.

Where an active matrix substrate having a considerable length larger than 40 inches is exposed, in particular, a single large one-piece photomask must be used to expose such a large substrate, since it is difficult to implement the halftone exposing step by using two or more photomasks which are joined together. Namely, it is difficult to suitable join the two or more photomasks into a mask assembly. Where the photomask has a length of 40 inches or more, it takes a considerable time to change the photomask, resulting in a considerable reduction in the throughput. The throughput can be appreciably improved by implementing a combination exposure process in which the photomask exposure and the spot scan exposure may be effected independently of each other by a single device such as the scan-exposing devices 100, 110, 120, 130, which incorporates means for effecting photomask scan exposure using a photomask, and means for effecting spot scan exposure using condensed spot lights. It is also noted that the photomask scan exposure using the photomask as shown in FIG. 12A and the spot scan exposure shown in FIG. 12B may be effected concurrently, so as to maximize the efficiency of the halftone exposing process in the second embodiment.

Figure 13:
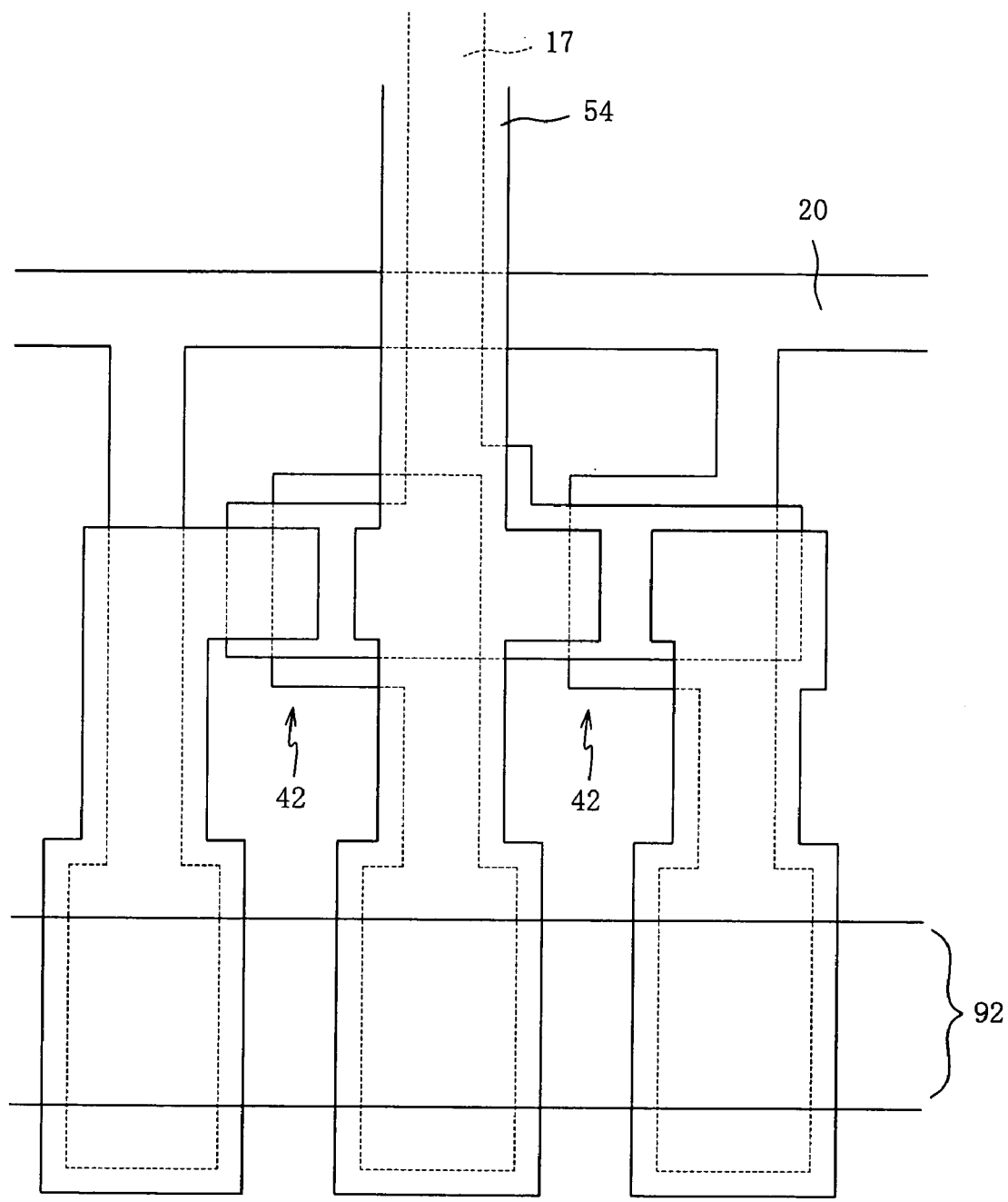
FIG. 13 is a plan view of a static-electricity protective transistor element formed in the combination exposing step according to the second embodiment.
Figure 14:
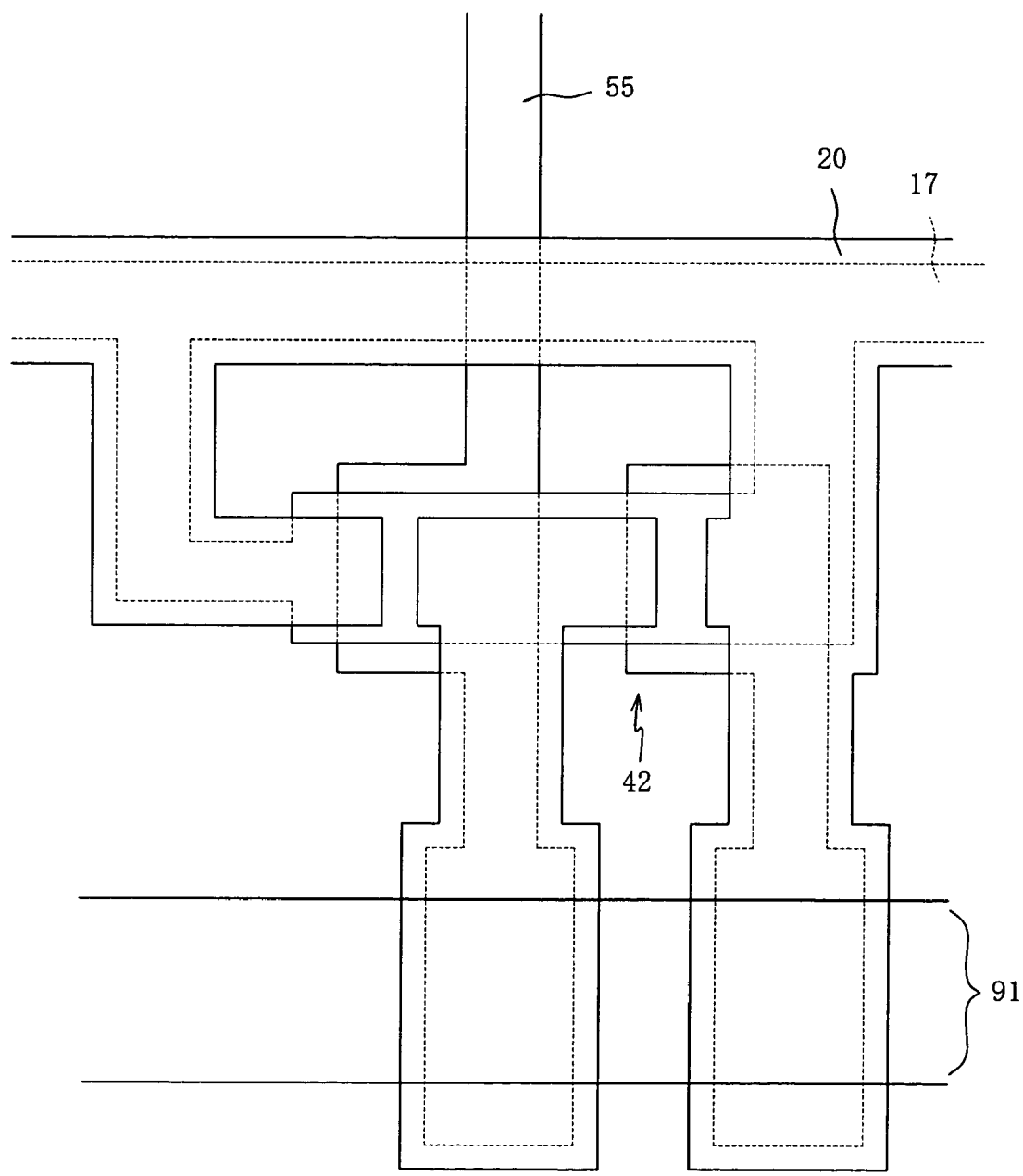
FIG. 14 is a plan view of a static-electricity protective transistor element also formed according to the second embodiment.
Figure 15A:
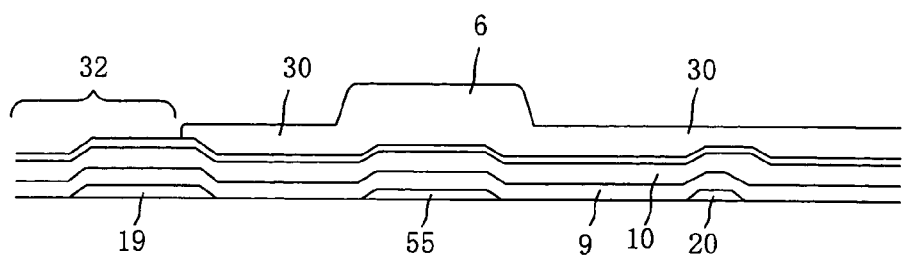
FIG. 15A through FIG. 15E are elevational views in cross section of an active matrix substrate, explaining the halftone exposing step according to the second embodiment.
Figure 15B:
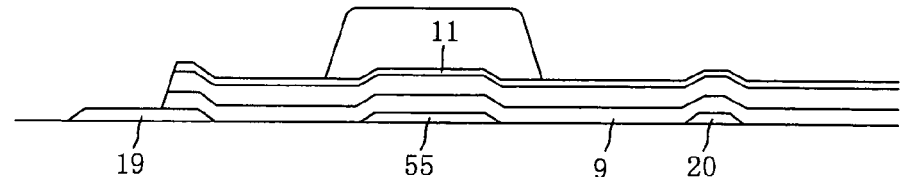
Figure 15C:
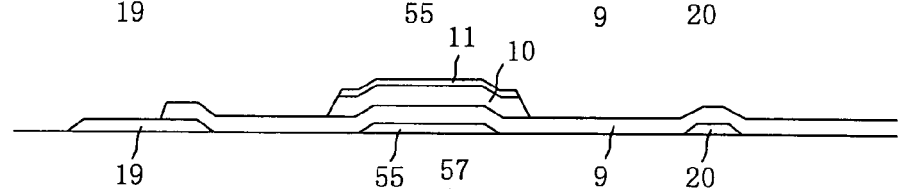

The plan views of FIGS. 13 and 14 show the static-electricity protective transistor elements 42 formed by the combination exposure process. The contact groove 91 serving as the first connecting portion, and the contact groove 92 serving as the second connecting portion are formed by spot scan-exposing means. The plan view of FIGS. 16 and 21 show active matrix substrates of transverse electric-field type manufactured by the process of the second embodiment. These substrates have a static-electricity protective circuit 102 consisting of a single static-electricity protective transistor element 42 or a plurality of static-electricity protective transistor elements. The contact groove 93 serving as the third connecting portion has a width $L_3$ larger than widths $L_1$ and $L_2$ of the first and second connecting portions, that is, the contact grooves 91 and 92 of the terminal portions of the static-electricity protective transistor elements 42. Namely, the widths L1–L3 are determined so as to satisfy the following equation (1), which is formulated to minimize the contact resistance of the terminal portions of the scanning lines, for preventing a variation in the horizontal stripes on the screen of the display device.

$$L_1 = L_2 = (1-x) \times L_3 \qquad (1)$$

wherein the value "x" is equal to or larger than $\frac{1}{100}$, and is equal to or smaller than $\frac{1}{2}$.

The cross sectional views of FIGS. 15A–15E show the active matrix substrate 9, for explaining three photomasking steps in the combination exposure according to the second embodiment. As in the first embodiment, the channel portion 57 of the thin-film transistor element 58 is not formed in the halftone exposing step, so that the length of the channel portion 57 has substantially no variation, making it possible to minimize a display variation due to a variation in the characteristic of the thin-film transistor element 58.

Figure 15D:
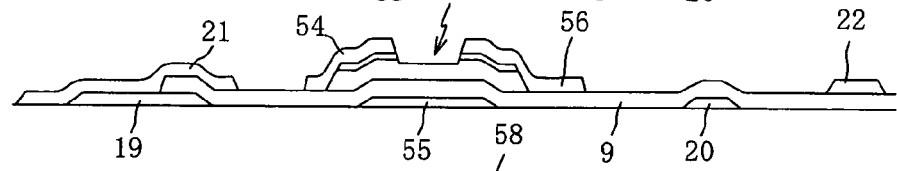

After the halftone exposing step, the source electrode 54 and the drain electrode 56 are formed, as shown in FIG. 15D, by removing by dry etching an $n^+$ layer which is formed by doping an ohmic contact layer in the form of the semiconductor layer 11 with phosphor.

Figure 15E:
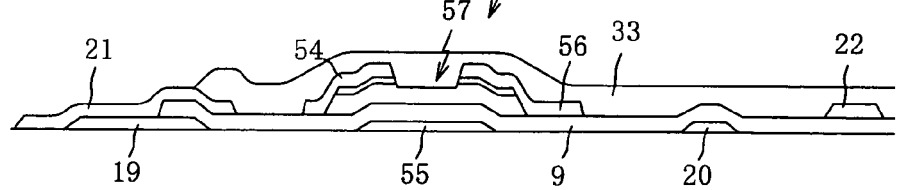

Then, a passivation step in the second embodiment will be described. In the passivation step, the surface of the channel portion 57 is subjected to a plasma doping treatment in a hydrogen or nitrogen atmosphere containing a diborane ($B_2H_6$) gas, and the surface is then coated with a transparent flattening film 33 formed of BCB (benzocyclo butene) or polyphenyl silazane, as shown in FIG. 15E, by ink-jet printing, flexible printing, or any other suitable printing method. The transparent flattening film 33 has a thickness ranging from about 0.2 µm (2000A) to about 0.6 µm (6000A). This transparent flattening film 33 may be replaced by a polyimide film, which is usually used as an orientation film coated on an active matrix substrate. In this case, the polyimide film functions not only as a flattening film but also as an orientation film.

If the passivation step described above were not implemented, that is, if the substrate were not subjected to "back channel doping" wherein the surface of the channel portion 57 is subjected to the plasma doping treatment in the hydrogen or nitrogen gas containing the diborane ($B_2H_6$) gas, the thin-film transistor element 58 would not exhibit a high degree of reliability for a long period of time. If the back channel doping cannot be implemented for some reason or other, the contact groove may be formed by first forming a silicone nitriding film having a thickness from about 0.2 µm (2000A) to about 0.4 µm (4000A), by plasma CVD, then applying a positive resist to the thus formed film, subjecting only the terminal portions of the scanning-line terminal portion 19 and the static-electricity protective transistor elements 42 to a spot scan-exposing operation, and after the development, implementing a dry etching operation so as to form the contact groove.

Figure 4:
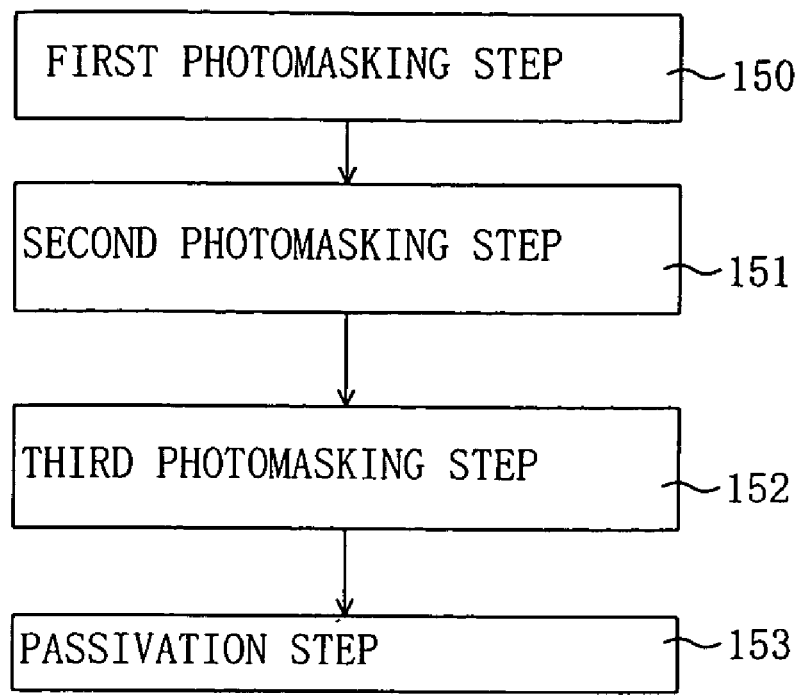
FIG. 4 is a flow chart illustrating a photomasking process according to a second embodiment of the present invention.

Referring to the flow chart of FIG. 4, there is illustrated the photomasking steps in the process of manufacture of a liquid crystal display device of transverse electric-field type according to the second embodiment of the invention. In a first photomasking step 150, a positive resist is applied to portions of the substrate 9 which correspond to the gate electrode 55 and the common electrode 20. In a second photomasking step 151, the positive resist portion 6 is formed on a portion of the substrate 9 which corresponds to the thin-film transistor element 58, and the resist-free area 32 is formed on portions of the substrate 9 which correspond to the contact grooves 91, 92, 93, while a positive resist portion 30 is formed on the other portions of the substrate 9, as shown in FIG. 15A. The second photomasking step 151 is the halftone exposing step in the second embodiment. In a third photomasking step 152, a positive resist is applied to portions of the substrate 9 which correspond to the source electrode 54, drain electrode 56 and picture-element electrode 22. In a passivation step 153, the back channel portion of the thin-film transistor element 58 is subjected to the plasma doping treatment using a $B_2H_6$ gas, and is then coated with a layer of BCB, polyphenyl silazane or an organic material by ink-jet coating or flexo graphic printing method.

According to the second embodiment, the active matrix substrate 9 can be manufactured by only three photomasking steps, making it possible to considerably reduce the required number of process steps.

Figure 17:
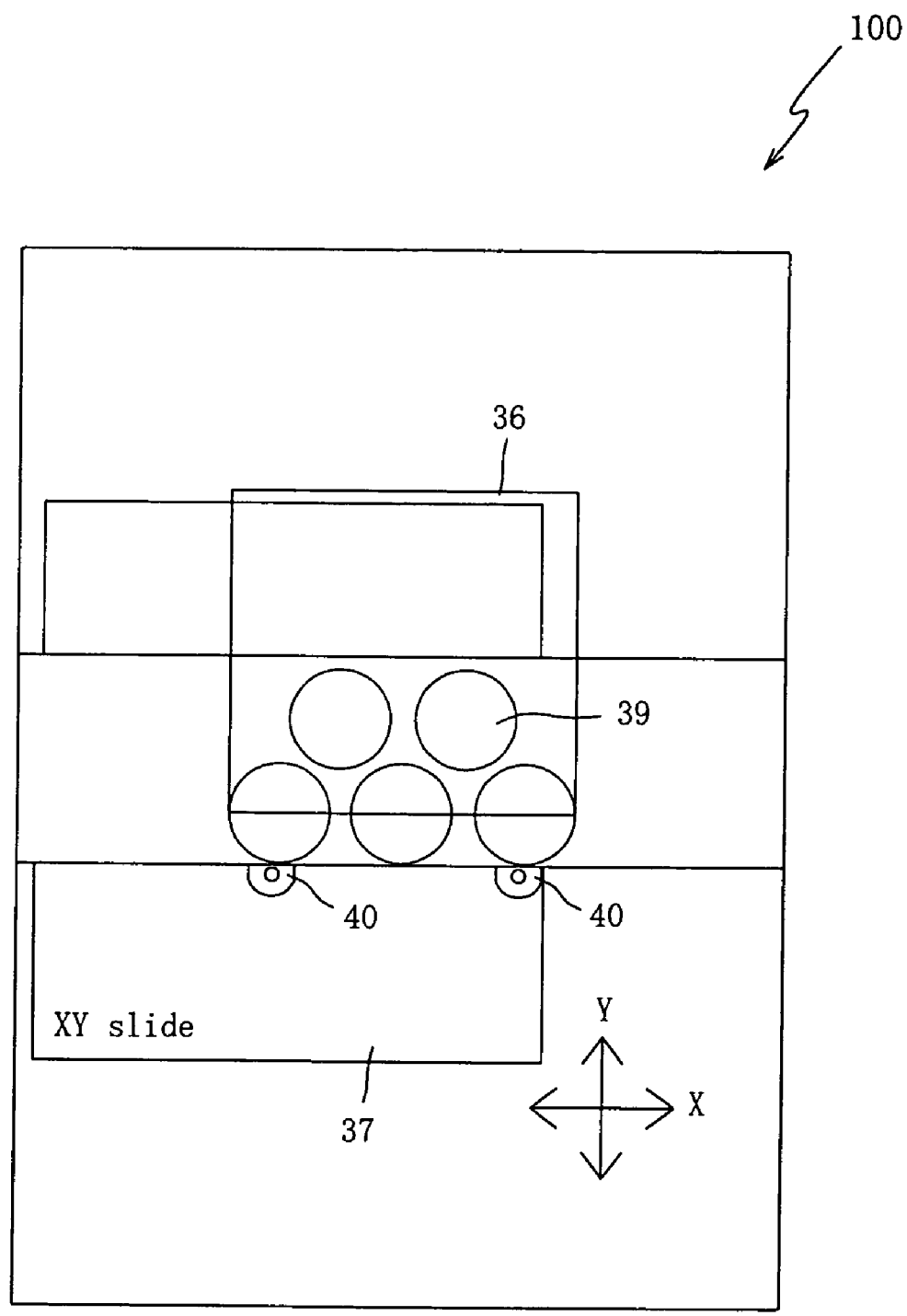
FIG. 17 is a plan view of a scan-exposing device used to effect a halftone exposing step according to a third embodiment of the present invention.

There will next be described a third embodiment of this invention. The plan view of FIG. 17 shows the scan-exposing device 100 used in the third embodiment. The scan-exposing device 100 is a multiple-lens type scan-exposing device including: an XY slide 37 which is arranged to hold a glass substrate and movable in the X-axis and Y-axis directions; a photomask substrate 36 which is movable in the Y-axis direction only; and a projection optical system 39. The scan-exposing device 100 includes a spot scan-exposing optical system in the form of stationary spot scan-exposing modules 40, so that the spot scan exposure by the spot scan-exposing means using the spot scan-exposing modules 40 can be implemented after the photomask scan exposure by the photomask scan-exposing means using the photomask substrate 36. The spot scan exposure is effected with a spot size ranging from about 0.1 mm to about 0.5 mm.

Figure 18:
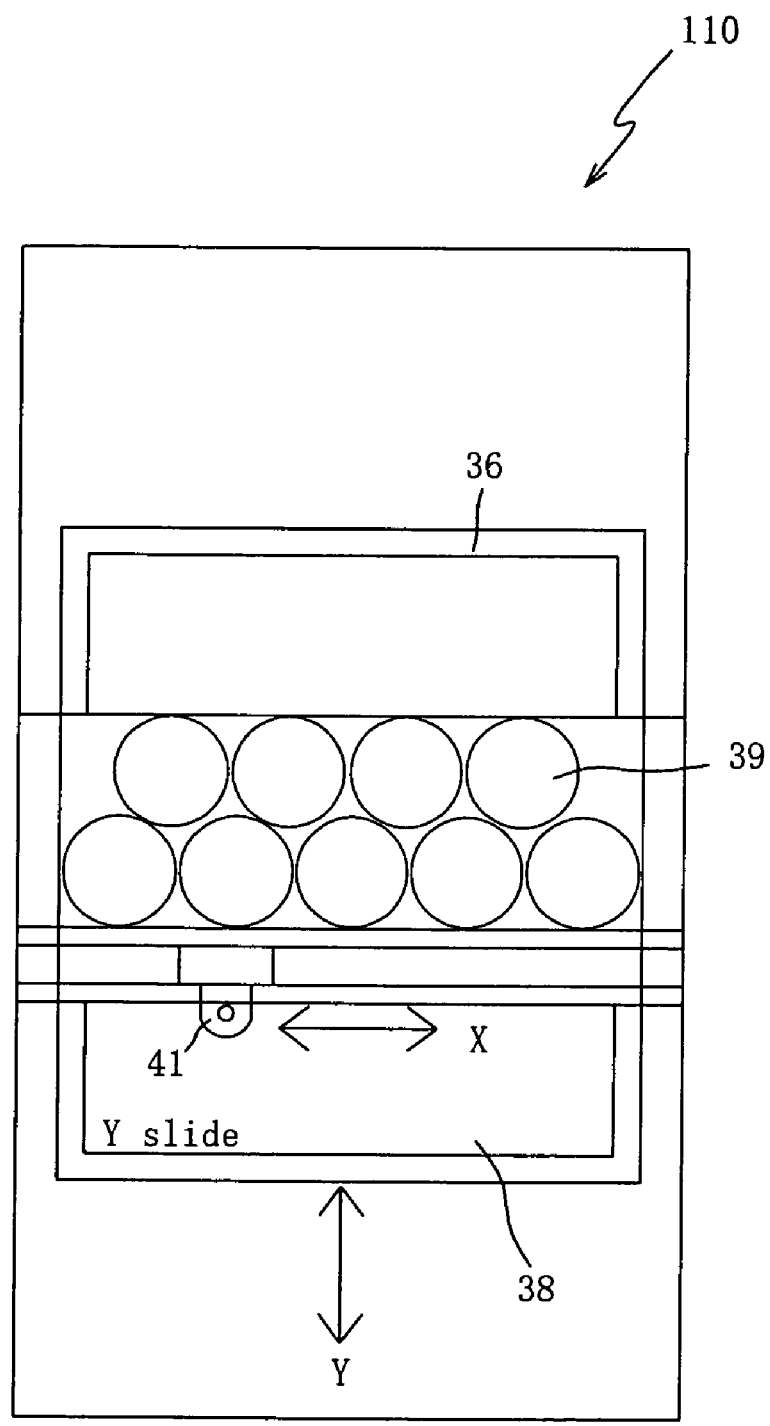
FIG. 18 is a plan view of a scan-exposing device used to effect a halftone exposing step according to a fourth embodiment of the invention.

The scan-exposing device 110 shown in the plane view of FIG. 18 is used in a fourth embodiment of this invention. This scan-exposing device 110 includes a Y-axis slide 38 which is movable in the Y-axis direction only, a projection optical system 39, and a spot scan-exposing optical system in the form of a spot scan-exposing optical module 41 which is movable in the X-axis only. In this scan-exposing device 110, the spot scan exposure using the spot scan-exposing optical module 41 is effected in the Y-axis direction with a spot size ranging from about 0.1 mm to about 0.5 mm, while the photomask scan exposure using the photomask substrate 36 is effected in the Y-axis direction. After the photomask scan exposure in the Y-axis direction by the photomask scan-exposing means using the photomask substrate 36 is effected over the entire surface of the substrate, the spot scan exposure by the spot scan-exposing means using the spot scan-exposing optical module 41 is effected in the X-axis direction.

Where a 60-inch active matrix liquid crystal display device is manufactured, there may arise an undesirable problem of deflection of a quartz photomask substrate due to its own weight. One considered solution to this problem of deflection of the photomask substrate is to dispose the quartz photomask substrate so as to extend in the longitudinal direction. Where the glass substrate is extremely large, the weight of the slide is accordingly large, and the slide cannot be smoothly moved.

Figure 23:
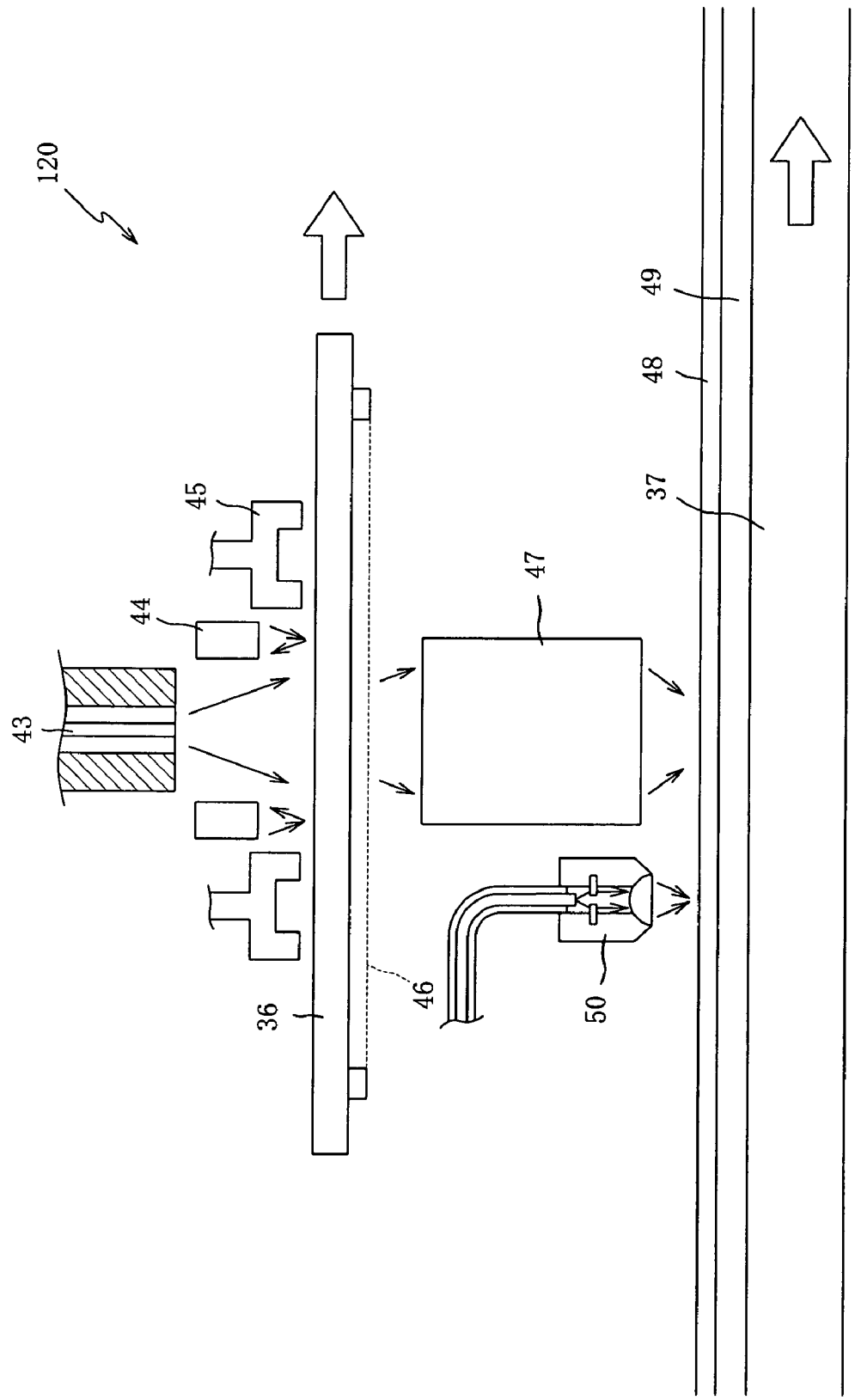
FIG. 23 is an elevational view in cross section showing a scan-exposing device used to effect a halftone exposing step according to a fifth embodiment of the present invention.

The scan-exposing device 120 used in a fifth embodiment of the invention is shown in the cross sectional view of FIG. 23. This scan-exposing device 120 includes: a UV source 43 which is operable to generate the ultraviolet radiation and which is disposed on one of opposite sides of the quartz photomask substrate 36; non-contact type chucks in the form of Bernoulli chucks 45 which are disposed on the same side of the quartz photomask substrate 36 and which are operable to control local vertical positions of the photomask substrate 36, so as to reduce the amount of deflection of the substrate 36 due to its own weight; and red-laser displacement meters or gages 44 operable to measure a vertical displacement of the quartz photomask substrate 36, at its surface on the side of the Bernoulli chucks 45. The scan-exposing device 120 thus constructed is capable of exposing a glass substrate 49 (active matrix substrate), while compensating for the deflection of the quartz photomask substrate 36 due to its own weight, namely, while accurately controlling the position of the substrate 36 as held by the Bernoulli chucks 45, on the basis of the displacement measured by the red-laser displacement meters 44. To this end, a suitable substrate-position control device is provided to control the Bernoulli chucks 45 so as to reduce the amount of deflection of the quartz photomask substrate 36. Referring next to the cross sectional view of FIG. 24, there is shown the scan-exposing device 130 used in a sixth embodiment of this invention, wherein a quartz substrate 76 is disposed in opposition to the quartz photomask substrate 36 such that these substrates 76, 36 cooperate to define therebetween an air-tight space. The scan-exposing device 130 is capable of exposing the glass substrate 49, while compensating for the deflection of the quartz photomask substrate 36 due to its own weight, by controlling the pressure within the enclosed space, which is measured by a pressure sensor 51. To this end, a suitable pressure control device is provided to control the pressure within the air-tight space such that the pressure in the air-tight space is lower than the atmospheric pressure by a suitable difference, so as to reduce the deflection of the substrate 36. The scan-exposing devices 120, 130 eliminate a need of increasing the thickness of the quartz photomask substrate 36 to reduce its amount of deflection, even where the substrate 36 has a large size (e.g., 60 inches), making it possible to reduce the cost of the quartz photomask substrate 36. Further, the devices 120, 130 simplify the manufacture of the photomask substrate, resulting in a further reduction in the cost of manufacture of the quartz photomask substrate.

As shown in FIGS. 23 and 24, the scan-exposing devices 120, 130 include a spot scan-exposing optical module 50 for implementing the spot scan exposure without using the quartz photomask substrate 36. The spot scan-exposing optical module 50 corresponds to the spot scan-exposing optical system, and is interposed between the photomask substrate 36 and the glass substrate 49, so that the glass substrate 49 is subjected to the spot scan exposure to a ultraviolet radiation transmitted through an optical fiber. The width of the spot scan exposure by the optical module 50 can be adjusted as needed. Reference sign 46 in FIGS. 23 and 24 denotes a pellicle provided to prevent adhesion of foreign matters to the photomask substrate 36.

The yield ratio of the liquid crystal display can be improved by: first implementing the photomask scan exposure of the entire surface of the glass substrate 49 to the ultraviolet radiation by the photomask scan-exposing means through the quartz photomask substrate 36, with the density of the ultraviolet radiation being lowered so as to remove only a portion of the thickness of a photoresist 48; and then implementing the spot scan exposure of the glass substrate 49 by the spot scan-exposing means using the spot scan-exposing optical module 50. In the photomask scan exposure to the reduced density of the ultraviolet radiation, the required patterning resolution of the photoresist ranges from about 3 μm to about 10 μm. In the spot scan exposure, on the other hand, the required photoresist patterning resolution is as low as about 100 μm. To improve the yield ratio, therefore, the photomask scan exposure of the glass substrate 49 which requires the higher resolving power must be implemented before dust is deposited on the glass substrate 49.

The compensation for the deflection of the photomask substrate 36 due to its own weight must be dynamically effected to hold the flatness of the substrate 36 within about ±15 μm from the horizontal plane, by using a laser displacement meter or gage or a digital differential pressure gage. The accuracy of the compensation must be changed as needed, depending upon the depth of focus of a projection lens 47 and the required resolving power. The red-laser displacement meters 44 shown in FIG. 23 or any other laser displacement meters may be used as the laser displacement meter.

Figure 19:
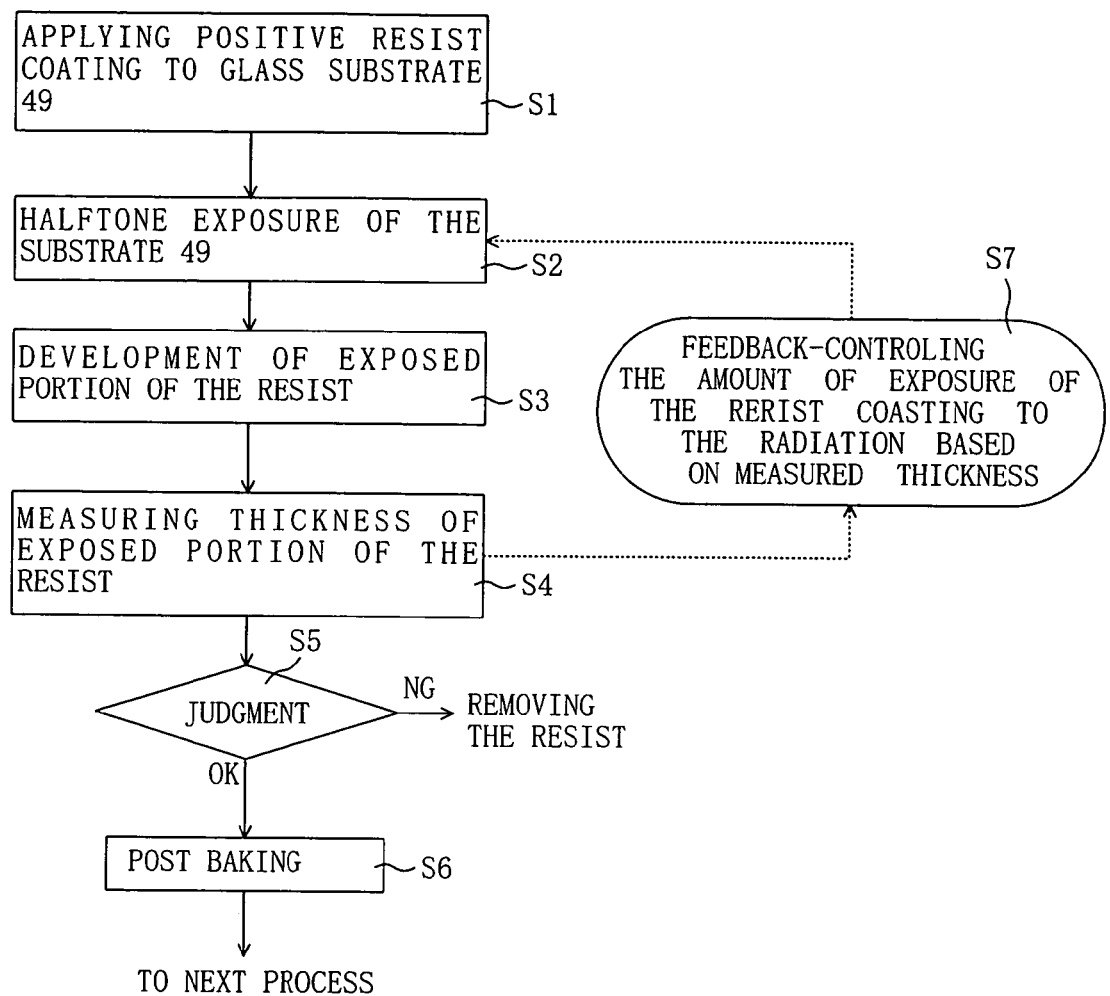
FIG. 19 is a flow chart illustrating a feedback control used to effect the halftone exposing step of the present invention.

In the third through sixth embodiments, the halftone exposure is feedback-controlled according to a feedback control routine illustrated in the flow chart of FIG. 19. This feedback control routine is initiated with step S1 to apply a positive resist coating of 1.5–2.0 μm to the glass substrate 49. Step S1 is followed by step S2 to implement the halftone exposure of the glass substrate 49. After the halftone-exposed portion of the positive resist coating is developed in step S3, the control flow goes to step S4 to measure the actual thickness of the halftone-exposed and developed portion of the positive resist coating. Step S4 is followed by step S7 to feedback-control the amount of exposure of the positive resist coasting to the radiation, on the basis of the measured thickness of the halftone-exposed portion of the positive resist coating, so that the measured thickness is held within a predetermined range between about 0.4 μm (4000A) and about 0.6 μm (6000A). To this end, a suitable feedback control device is provided to feedback-control the amount of exposure of the resist coasting to the radiation. During repeated implementation of steps S2, S3, S4 and S4, step S5 is implemented to determine whether the measured thickness falls within the predetermined range. If an affirmative decision is obtained in step S5, the control flow goes to step S6 to perform a post-braking operation on the glass substrate 49. If the thickness measured a predetermined time after initiation of the feedback control in step S7 considerably deviates from the lower or upper limit of the predetermined range, the positive resist coating is removed from the glass substrate 49, and a positive resist coating is applied again to the glass substrate, and the halftone exposure must be effected again.

Figure 20:
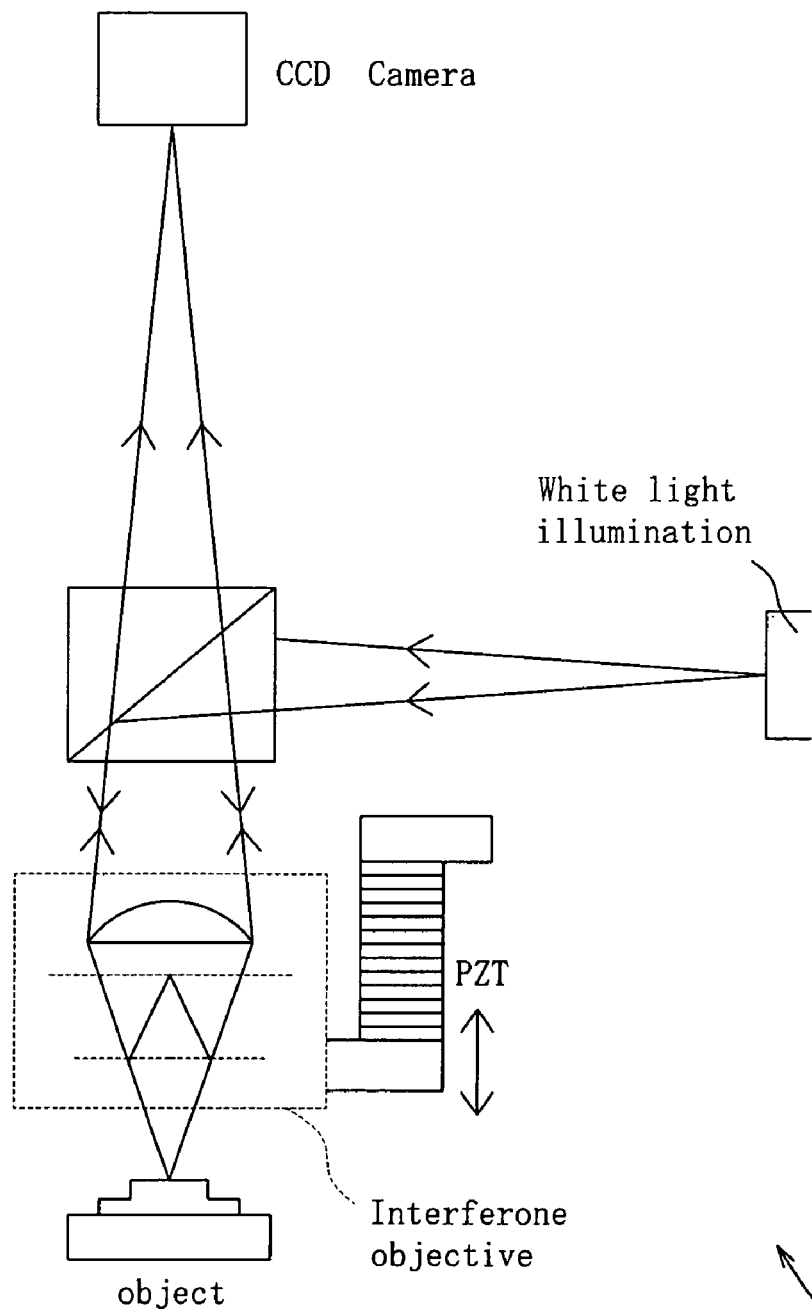
FIG. 20 is a view showing an optical principle of a white light interferometer used according to the present invention, for measuring steps between positive resists having a first and a second thickness and an areas not coated with a positive resist.

To assure a high degree of reproducibility of the halftone-exposed portion of the positive resist with high uniformity, it is desirable to inspect all of the workpieces of the glass substrate 49 in step S5. This inspection may be made by using film-thickness measuring means such as a laser thickness gage or a laser interferometer. In this specific example, a white light interferometer 68 is used to accurately measure a difference between the actual values of the thicknesses of the non-halftone-exposed portion and the halftone-exposed portion of the positive resist coating. The principle of operation of the white light interferometer 68 is illustrated in FIG. 20. This white light interferometer 68 permits simultaneous measurement of the difference between the first and second thickness values of the above-indicated two positive resist portions, and the second thickness value of the halftone-exposed portion of the positive resist as measured from the surface of the glass substrate 49 (from the resist-free area of the substrate). Accordingly, the required time for the measurement can be reduced.

The white light interferometer 68 shown in FIG. 20 is simple in operation principle and construction, and has measuring accuracy of about 1 nm (10A), and is available at a considerably low cost even where the measuring system is arranged to measure a plurality of points at one time. Further, the required measuring time of the white light interferometer 68 is relatively short, it may be used as an in-line inspection device. By feedback-controlling the condition of the photomask scan exposure of the glass substrate 49 on the basis of an output of the white light interferometer 68, the halftone exposure can be effected with a high degree of reproducibility, namely, without a variation in the thickness values of the positive resist pattern formed on the active matrix substrate.

While the scan-exposing devices 100 and 110 used in the third and fourth embodiments include the projection optical system 39 of multiple lens type, the scan-exposing devices may use a mirror-reflection type optical system.

The third through sixth embodiments using the scan-exposing devices 100, 110, 120, 130 and the white light interferometer 68 to feedback-control the halftone exposure on the basis of the output of the white light interferometer 68 assure a high degree of reproducibility of the halftone exposure, permitting a significant improvement of the yield ratio of the active matrix substrate. In these embodiments, the overall photomask scan exposure of the active matrix substrate to the reduced density of radiation through the photomask substrate 36 is suitably combined with the spot scan exposure of the active matrix substrate by the spot scan-exposing means, to implement the halftone exposing step which permits a considerable reduction in the variation of the characteristic of the thin-film transistor element, as compared with the conventional halftone exposing step. Thus, the present invention permits economical manufacture of an active matrix element with a high yield ratio, using an inexpensive photomask.

It is to be understood that the present invention may be embodied with various other changes, modifications and improvements, those skilled in the art, without departing from the spirit and scope of the invention defined in the following claims:

What is claimed is:

1. A process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with said picture-element electrodes, and (g) thin-film transistor elements connected to said scanning lines and said image-signal wires, and wherein said scanning lines, said image-signal wires, said picture-element electrodes, said common electrodes and said thin-film transistor elements are provided on a surface of one of said pair of substrates which faces said layer of the liquid crystal composition, said process comprising:

a halftone exposing step of exposing a photoresist on said one of said pair of substrates to a radiation, and thereby forming (i) first positive resist portions that cover portions of a semiconductor layer formed on said one substrate, which portions correspond to said thin-film transistor elements, each of said first positive resist portions having a predetermined first thickness, (ii) resist-free areas that cover portions of said semiconductor layer which correspond to a first connecting portion, a second connecting portion and a third connecting portion, said first connecting portion being provided to form first static-electricity protective transistor elements connecting said common electrodes and said scanning lines, said second connecting portion being provided to form second static-electricity protective transistor elements connecting said common electrodes and said image-signal wires, and said third connecting portion connecting said external scanning-line driver circuit and said scanning-line terminal portions, and (iii) second positive resist portions having a second thickness smaller than said first thickness and covering the other portions of said semiconductor layer.

2. The process according to claim 1, wherein said halftone exposing step is implemented by using a halftone photomask having a fully light-transmitting area, a semi-light-transmitting area and a fully light-shielding area, such that said first positive resist portions having said first thickness are formed with said fully light-shielding area of said halftone photomask preventing said radiation from exposing the portions of the semiconductor layer which correspond to said thin-film transistor elements, and said resist-free areas are formed with said fully light-transmitting area of said halftone photomask permitting said radiation to expose the portions of the semiconductor layer which correspond to the first, second and third connecting portions of said semiconductor layer, while said second positive resist portions having said second thickness are formed with said semi-light-transmitting area of said halftone photomask permitting partial exposure of said other portions of said semiconductor layer to said radiation.

3. A process according to claim 1, wherein said halftone exposing step is implemented by using a photomask having a fully light-transmitting area and a fully light-shielding area, while said photoresist on said semiconductor layer is exposed through said photomask to a ultraviolet radiation whose irradiation energy density is determined so as to remove only a portion of a thickness of said photoresist, said halftone exposing step being implemented such that said first positive resist portions having said first thickness are formed with said fully light-shielding area of said photomask preventing said ultraviolet radiation from exposing said portions of the semiconductor layer which correspond to said thin-film transistor elements, while said second positive resist portions having said second thickness are formed with said fully light-transmitting area of said photomask permitting said ultraviolet radiation to expose said other portions of the semiconductor layer, and wherein said halftone exposing step further includes an operation performed after said first and second positive resist portions are formed, to form said resist-free areas by exposing portions of said photoresist exposed to said ultraviolet radiation, which portions cover the portions of the semiconductor layer corresponding to said first, second and third connecting portions, such that said portions of the photoresist are exposed to a radiation through another photomask different from said photomask used to form said first and second positive resist portions, or to respective spot lights of a condensed ultraviolet radiation.

4. A process according to claim 1, wherein said halftone exposing step is implemented by using a photomask having a fully light-transmitting area and a fully light-shielding area, while said photoresist on said semiconductor layer is exposed through said photomask to a ultraviolet radiation whose irradiation energy density is determined so as to remove only a portion of a thickness of said photoresist, said halftone exposing step being implemented such that said first positive resist portions having said first thickness are formed with said fully light-shielding area of said photomask preventing said ultraviolet radiation from exposing said portions of the semiconductor layer which correspond to said thin-film transistor elements, and said second positive resist portions having said second thickness are formed with said fully light-transmitting area of said photomask permitting said ultraviolet radiation to expose said other portions of the semiconductor layer, while at the same time said resist-free areas are formed by exposing portions of said photoresist covering the portions of the semiconductor layer corresponding to said first, second and third connecting portions, to respective spot lights of a condensed ultraviolet radiation.

5. A process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with said picture-element electrodes, and (g) thin-film transistor elements connected to said scanning lines and said image-signal wires, and wherein said scanning lines, said image-signal wires, said picture-element electrodes, said common electrodes and said thin-film transistor elements are provided on a surface of one of said pair of substrates which faces said layer of the liquid crystal composition, said process comprising:

a first photomasking step of forming a positive resist that covers portions of a semiconductor layer formed on said one substrate, which portions correspond to gate electrodes of said thin-film transistor elements and said common electrodes;

a second photomasking step which is a halftone exposing step of forming a positive resist that covers portions of said semiconductor layer which correspond to said thin-film transistor elements where the positive resist has a thickness smaller than a positive resist corresponding to the thin-film transistor element formed on the other portion of the substrate, and forming resist-free areas that cover portions of said semiconductor layer which correspond to a first connecting portion, a second connecting portion and a third connecting portion, said first connecting portion being provided to form first static-electricity protective transistor elements connecting said common electrodes and said scanning lines, said second connecting portion being provided to form second static-electricity protective transistor elements connecting said common electrodes and said image-signal wires, and said third connecting portion connecting said external scanning-line driver circuit and said scanning line terminal portions;

a third photomasking step of forming a positive resist that covers portions of said semiconductor layer which correspond to source electrodes and drain electrodes of said thin-film transistor elements, and said picture-elements electrodes; and a fourth photomasking step of forming a positive resist for forming contact holes of said scanning-line terminal portions and contact holes of image-signal wire terminal portions.

6. A process of manufacturing a liquid crystal display device of transverse electric-field type including (a) a pair of substrates at least one of which is transparent, (b) a layer of a liquid crystal composition interposed between the pair of substrates, (c) a plurality of scanning lines driven by an external scanning-line driver circuit through scanning-line terminal portions and extending in a line direction, (d) a plurality of image-signal wires extending in a column direction, (e) picture-element electrodes corresponding to respective picture elements, (f) common electrodes cooperating with said picture-element electrodes, and (g) thin-film transistor elements connected to said scanning lines and said image-signal wires, and wherein said scanning lines, said image-signal wires, said picture-element electrodes, said common electrodes and said thin-film transistor elements are provided on a surface of one of said pair of substrates which faces said layer of the liquid crystal composition, said process comprising:

a first photomasking step of forming a positive resist that covers portions of a semiconductor layer formed on said one substrate, which portions correspond to gate electrodes of said thin-film transistor elements and said common electrodes;

a second photomasking step which is a halftone exposing step of forming a positive resist that covers portions of said semiconductor layer which correspond to said thin-film transistor elements where the positive resist has a thickness smaller than a positive resist corresponding to the thin-film transistor element formed on the other portion of the substrate, and forming resist-free areas that cover portions of said semiconductor layer which correspond to a first connecting portion, a second connecting portion and a third connecting portion, said first connecting portion being provided to form first static-electricity protective transistor elements connecting said common electrodes and said scanning lines, said second connecting portion being provided to form second static-electricity protective transistor elements connecting said common electrodes and said image-signal wires, and said third connecting portion connecting said external scanning-line driver circuit and said scanning line terminal portions;

a third photomasking step of forming a positive resist that covers portions of said semiconductor layer which correspond to source electrodes and drain electrodes of said thin-film transistor elements, and said picture-elements electrodes; and a passivation step of subjecting a back channel portion of each of said thin-film transistor elements to a plasma doping treatment with a $B_2H_6$ gas, and coating said back channel portion with a layer formed of one of BCB, polyphenyl silazane and an organic material by ink-jet coating or flexo graphic printing method.

* * * * *